United States Patent
Beard et al.

(10) Patent No.: US 10,997,931 B2
(45) Date of Patent: May 4, 2021

(54) AM-EWOD ARRAY ELEMENT CIRCUITRY WITH HIGH SENSITIVITY FOR SMALL CAPACITANCE

(71) Applicant: Sharp Life Science (EU) Limited, Oxford (GB)

(72) Inventors: Oliver James Beard, Oxford (GB); Benjamin James Hadwen, Oxford (GB)

(73) Assignee: Sharp Life Science (EU) Limited, Oxford (GB)

(*) Notice: Subject to any disclaimer, the term of this patent is extended or adjusted under 35 U.S.C. 154(b) by 0 days.

(21) Appl. No.: 16/207,789

(22) Filed: Dec. 3, 2018

(65) Prior Publication Data
US 2020/0175931 A1 Jun. 4, 2020

(51) Int. Cl.
  *G09G 3/34* (2006.01)
  *G02B 26/00* (2006.01)
  *H01L 27/12* (2006.01)

(52) U.S. Cl.
  CPC ........ *G09G 3/348* (2013.01); *G02B 26/005* (2013.01); *H01L 27/124* (2013.01); *H01L 27/1255* (2013.01); *G09G 2300/0809* (2013.01); *G09G 2330/12* (2013.01)

(58) Field of Classification Search
  None
  See application file for complete search history.

(56) References Cited

U.S. PATENT DOCUMENTS

| | | |
|---|---|---|
| 7,163,612 B2 | 1/2007 | Sterling et al. |
| 8,173,000 B1 | 5/2012 | Hadwen et al. |
| 8,653,832 B2 | 2/2014 | Hadwen et al. |
| 8,872,527 B2 | 10/2014 | Sturmer et al. |

(Continued)

OTHER PUBLICATIONS

Fair, R.B., "Digital microfluids: is a true lab-on-a-chip possible?" Microfluidics and Nanofluidics Jun. 2007, vol. 3, Issue 3, pp. 245-281.

*Primary Examiner* — Ifedayo B Iluyomade
(74) *Attorney, Agent, or Firm* — Renner, Otto, Boisselle & Sklar, LLP

(57) ABSTRACT

An AM-EWOD device includes a plurality of array elements arranged in an array of rows and columns, each of the array elements including array element circuitry, an element electrode, and a reference electrode. The array element circuitry includes actuation circuitry configured to apply actuation voltages to the element and/or reference electrodes for actuating the array element, and impedance sensor circuitry configured to sense impedance at the array element electrode to determine a droplet or device property at the array element, the impedance sensor circuitry comprising a sensor capacitor and a sensor readout transistor that outputs an output current for sensing. The sensor capacitor is electrically connected to a gate of the sensor readout transistor such that during a sensing phase a voltage perturbation is coupled through the sensor capacitor (and possibly other circuit elements) to the gate of the sensor readout transistor. The impedance sensor circuitry further comprises a precharging element that operates to turn on the sensor readout transistor during the sensing phase in combination with coupling of the voltage perturbation, thereby increasing the effect of the voltage perturbation on the output current.

24 Claims, 25 Drawing Sheets

(56) References Cited

U.S. PATENT DOCUMENTS

| | | |
|---|---|---|
| 2014/0151232 A1 | 6/2014 | Hadwen |
| 2017/0056887 A1* | 3/2017 | Hadwen et al. |
| 2017/0074814 A1* | 3/2017 | Hadwen ............ B01L 3/502792 |
| 2017/0076676 A1* | 3/2017 | Hadwen ................ G09G 3/348 |
| 2017/0326524 A1 | 11/2017 | Hadwen et al. |
| 2018/0078934 A1 | 3/2018 | Hadwen et al. |

* cited by examiner

PRIOR ART    Fig. 1
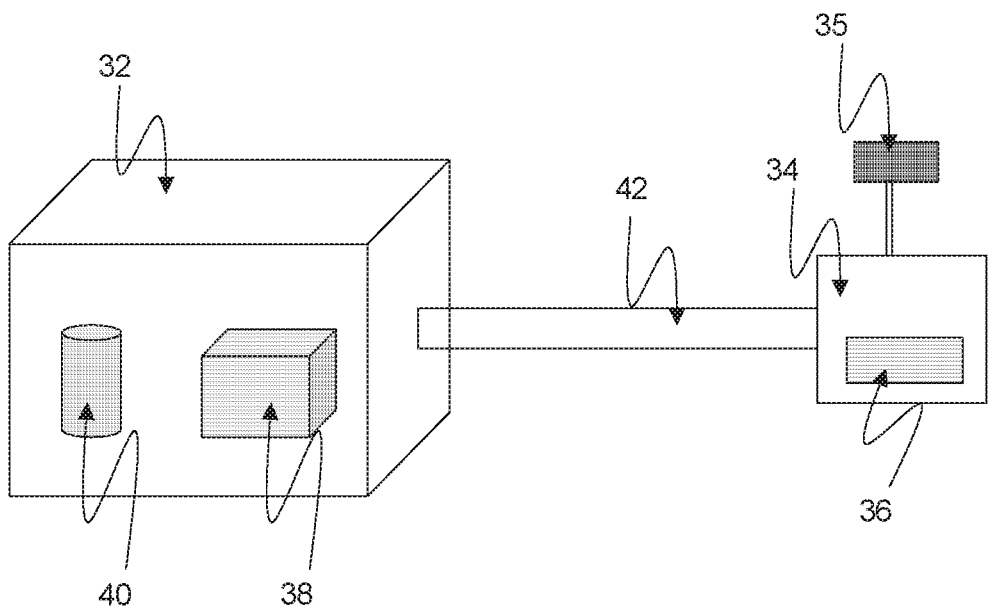
PRIOR ART    Fig. 2
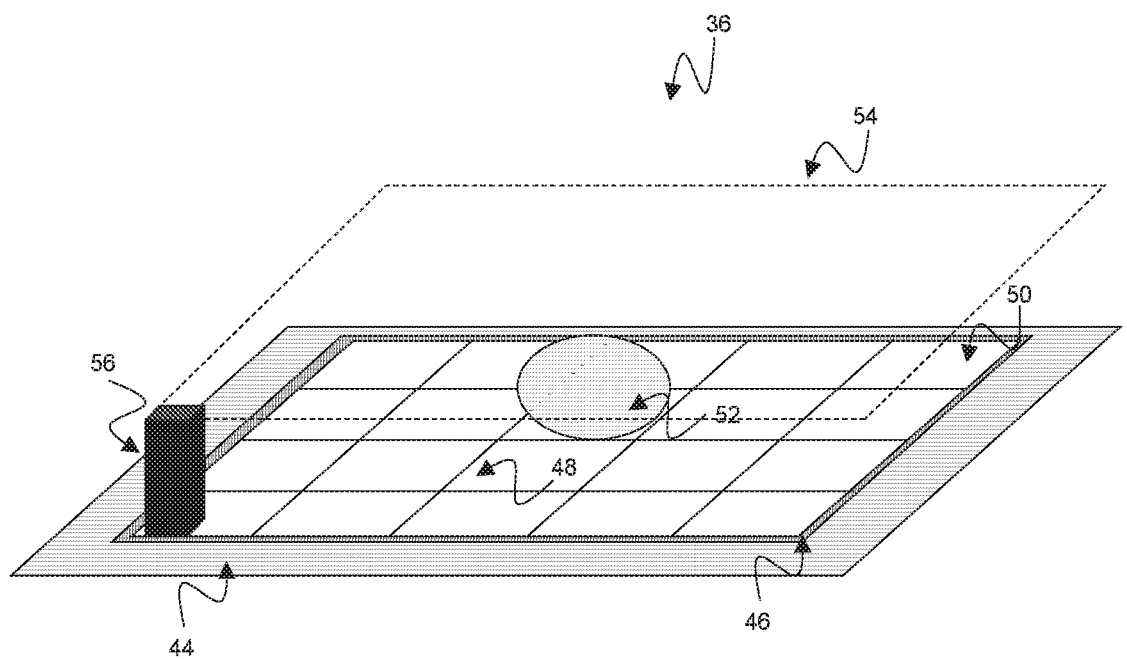

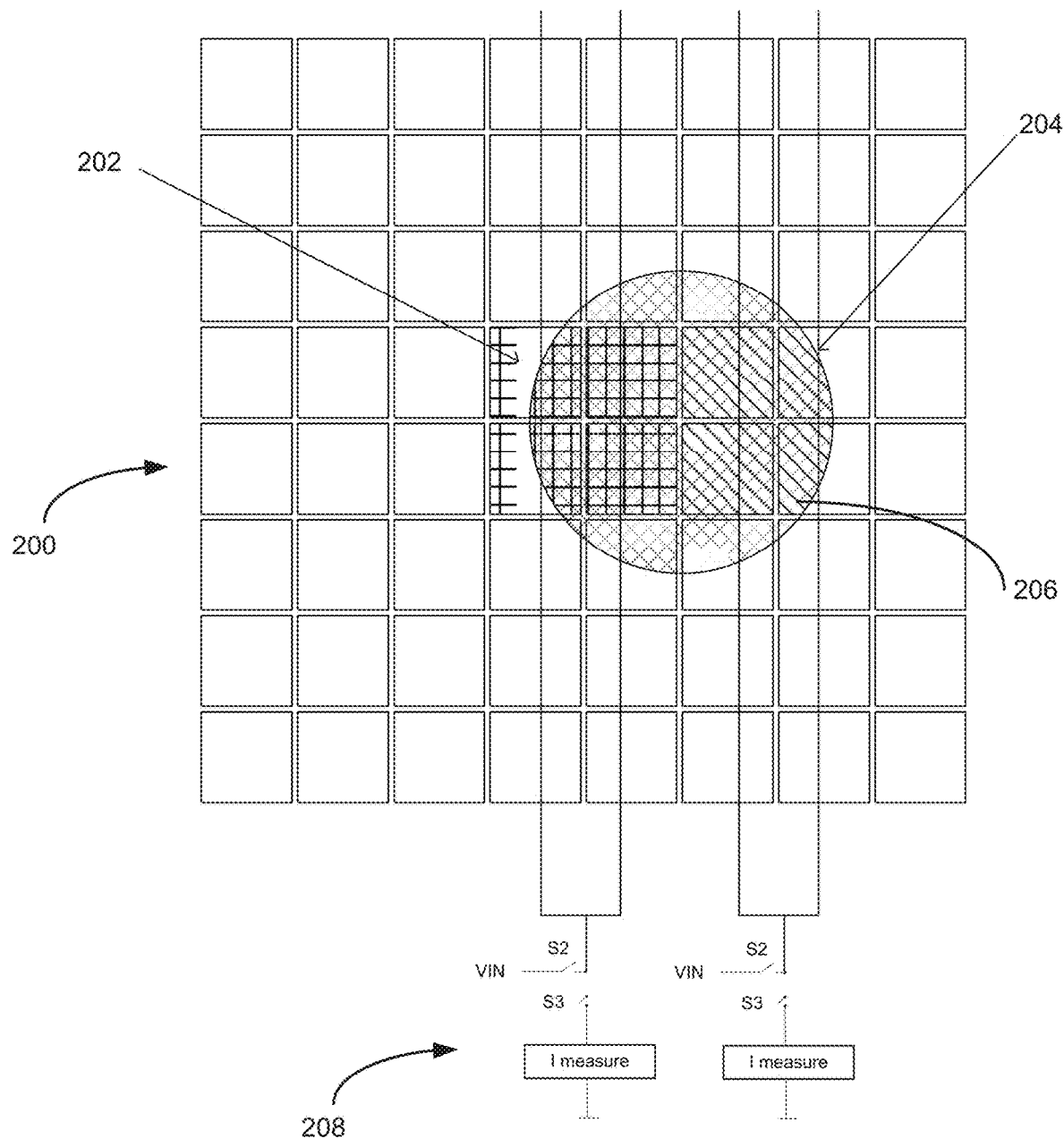

AM-EWOD ARRAY ELEMENT CIRCUITRY WITH HIGH SENSITIVITY FOR SMALL CAPACITANCE

TECHNICAL FIELD

The present invention relates to droplet microfluidic devices, and more specifically to Active Matrix Electrowetting-On-Dielectric (AM-EWOD) devices and to configurations of the array element circuitry of the array elements of such a device to optimize sensing capabilities particularly for low capacitance sensing.

BACKGROUND ART

Electrowetting on dielectric (EWOD) is a well-known technique for manipulating droplets of fluid by application of an electric field. Active Matrix EWOD (AM-EWOD) refers to implementation of EWOD in an active matrix array incorporating transistors, for example by using thin film transistors (TFTs). It is thus a candidate technology for digital microfluidics for lab-on-a-chip technology. An introduction to the basic principles of the technology can be found in "Digital microfluidics: is a true lab-on-a-chip possible?", R. B. Fair, Microfluid Nanofluid (2007) 3:245-281).

FIG. 1 is a drawing depicting an exemplary EWOD based microfluidic system. In the example of FIG. 1, the microfluidic system includes a reader 32 and a cartridge 34. The cartridge 34 may contain a microfluidic device, such as an AM-EWOD device 36, as well as (not shown) fluid input ports into the device and an electrical connection as are conventional. The fluid input ports may perform the function of inputting fluid into the AM-EWOD device 36 and generating droplets within the device, for example by dispensing from input reservoirs as controlled by electrowetting. As further detailed below, the microfluidic device includes an electrode array configured to receive the inputted fluid droplets.

The microfluidic system further may include a control system configured to control actuation voltages applied to the electrode array of the microfluidic device to perform manipulation operations to the fluid droplets. For example, the reader 32 may contain such a control system configured as control electronics 38 and a storage device 40 that may store any application software and any data associated with the system. The control electronics 38 may include suitable circuitry and/or processing devices that are configured to carry out various control operations relating to control of the AM-EWOD device 36, such as a CPU, microcontroller or microprocessor.

In the example of FIG. 1, an external sensor module 35 is provided for sensor droplet properties. For example, optical sensors as are known in the art may be employed as external sensors for sensing droplet properties. Suitable optical sensors include camera devices, light sensors, charged coupled devices (CCD) and similar image sensors, and the like. A sensor additionally or alternatively may be configured as internal sensor circuitry incorporated as part of the drive circuitry in each array element. Such sensor circuitry may sense droplet properties by the detection of an electrical property at the array element, such as impedance or capacitance.

FIG. 2 is a drawing depicting additional details of the exemplary AM-EWOD device 36 in a perspective view. The AM-EWOD device 36 has a lower substrate assembly 44 with thin film electronics 46 disposed upon the lower substrate assembly 44. The thin film electronics 46 are arranged to drive array element electrodes 48. A plurality of array element electrodes 48 are arranged in an electrode or element two-dimensional array 50, having N rows by M columns of array elements where N and M may be any integer. A liquid droplet 52 which may include any polar liquid and which typically may be aqueous, is enclosed between the lower substrate 44 and a top substrate 54 separated by a spacer 56, although it will be appreciated that multiple liquid droplets 52 can be present.

FIG. 3 is a drawing depicting a cross section through some of the array elements of the exemplary AM-EWOD 36 device of FIG. 2. In the portion of the AM-EWOD device depicted in FIG. 3, the device includes a pair of the array element electrodes 48A and 48B that are shown in cross section that may be utilized in the electrode or element array 50 of the AM-EWOD device 36 of FIG. 3. The AM-EWOD device 36 further incorporates the thin-film electronics 46 disposed on the lower substrate 44, which is separated from the upper substrate 54 by the spacer 56. The uppermost layer of the lower substrate 44 (which may be considered a part of the thin film electronics layer 46) is patterned so that a plurality of the array element electrodes 48 (e.g. specific examples of array element electrodes are 48A and 48B in FIG. 3) are realized. The term element electrode 48 may be taken in what follows to refer both to the physical electrode structure 48 associated with a particular array element, and also to the node of an electrical circuit directly connected to this physical structure. A reference electrode 58 is shown in FIG. 3 disposed upon the top substrate 54, but the reference electrode alternatively may be disposed upon the lower substrate 44 to realize an in-plane reference electrode geometry. The term reference electrode 58 may also be taken in what follows to refer to both or either of the physical electrode structure and also to the node of an electrical circuit directly connected to this physical structure.

In the AM-EWOD device 36, a non-polar fluid 60 (e.g. oil) may be used to occupy the volume not occupied by the liquid droplet 52. An insulator layer 62 may be disposed upon the lower substrate 44 that separates the conductive element electrodes 48A and 48B from a first hydrophobic coating 64 upon which the liquid droplet 52 sits with a contact angle 66 represented by θ. The hydrophobic coating is formed from a hydrophobic material (commonly, but not necessarily, a fluoropolymer). On the top substrate 54 is a second hydrophobic coating 68 with which the liquid droplet 52 may come into contact. The reference electrode 58 is interposed between the top substrate 54 and the second hydrophobic coating 68.

The contact angle θ for the liquid droplet is defined as shown in FIG. 3, and is determined by the balancing of the surface tension components between the solid-liquid ($\gamma_{SL}$), liquid-gas ($\gamma_{LG}$) and non-ionic fluid ($\gamma_{SG}$) interfaces, and in the case where no voltages are applied satisfies Young's law, the equation being given by:

$$\cos\theta = \frac{\gamma_{SG} - \gamma_{SL}}{\gamma_{LG}} \qquad \text{(equation 1)}$$

In operation, voltages termed the EW drive voltages, (e.g. $V_T$, $V_0$ and $V_{00}$ in FIG. 3) may be externally applied to different electrodes (e.g. reference electrode 58, element electrodes 48A and 48A, respectively). The resulting electrical forces that are set up effectively control the hydrophobicity of the hydrophobic coating 64. By arranging for different EW drive voltages (e.g. $V_O$ and $V_{00}$) to be applied to different element electrodes (e.g. 48A and 48B), the liquid droplet 52 may be moved in the lateral plane between the two substrates.

FIG. 4A shows a circuit representation of the electrical load 70A between the element electrode 48 and the reference electrode 58 in the case when a liquid droplet 52 is present. The liquid droplet 52 can usually be modeled as a resistor and capacitor in parallel. Typically, the resistance of the droplet will be relatively low (e.g. if the droplet contains ions) and the capacitance of the droplet will be relatively high (e.g. because the relative permittivity of polar liquids is relatively high, e.g. ~80 if the liquid droplet is aqueous). In many situations the droplet resistance is relatively small, such that at the frequencies of interest for electrowetting, the liquid droplet 52 may function effectively as an electrical short circuit. The hydrophobic coatings 64 and 68 have electrical characteristics that may be modelled as capacitors, and the insulator 62 may also be modelled as a capacitor. The overall impedance between the element electrode 48 and the reference electrode 58 may be approximated by a capacitor whose value is typically dominated by the contribution of the insulator 62 and hydrophobic coatings 64 and 68 contributions, and which for typical layer thicknesses and materials may be on the order of a pico-Farad in value.

FIG. 4B shows a circuit representation of the electrical load 70B between the element electrode 48 and the reference electrode 58 in the case when no liquid droplet is present. In this case the liquid droplet components are replaced by a capacitor representing the capacitance of the non-polar fluid 60 which occupies the space between the top and lower substrates. In this case the overall impedance between the element electrode 48 and the reference electrode 58 may be approximated by a capacitor whose value is dominated by the capacitance of the non-polar fluid and which is typically small, on the order of femto-Farads.

For the purposes of driving and sensing the array elements, the electrical load 70A/70B overall functions in effect as a capacitor, whose value depends on whether a liquid droplet 52 is present or not at a given element electrode 48. In the case where a droplet is present, the capacitance is relatively high (typically of order pico-Farads), whereas if there is no liquid droplet present the capacitance is low (typically of order femto-Farads). If a droplet partially covers a given electrode 48 then the capacitance may approximately represent the extent of coverage of the element electrode 48 by the liquid droplet 52.

U.S. Pat. No. 7,163,612 (Sterling et al., issued Jan. 16, 2007) describes how TFT based thin film electronics may be used to control the addressing of voltage pulses to an EWOD array by using circuit arrangements very similar to those employed in active matrix display technologies. The approach of U.S. Pat. No. 7,163,612 may be termed "Active Matrix Electrowetting on Dielectric" (AM-EWOD). There are several advantages in using TFT based thin film electronics to control an EWOD array, namely:

Electronic driver circuits can be integrated onto the lower substrate.

TFT-based thin film electronics are well suited to the AM-EWOD application. They are cheap to produce so that relatively large substrate areas can be produced at relatively low cost.

TFTs fabricated in standard processes can be designed to operate at much higher voltages than transistors fabricated in standard CMOS processes. This is significant since many EWOD technologies require electrowetting voltages in excess of 20V to be applied.

FIG. 5 is a drawing depicting an exemplary arrangement of thin film electronics 46 in the exemplary AM-EWOD device 36 of FIG. 2. The thin film electronics 46 is located upon the lower substrate 44. Each array element 51 of the array of elements 50 contains an array element circuit 72 for controlling the electrode potential of a corresponding element electrode 48. Integrated row driver 74 and column driver 76 circuits are also implemented in thin film electronics 46 to supply control signals to the array element circuit 72. The array element circuit 72 may also contain a sensor capability for detecting the presence or absence of a liquid droplet in the location of the array element. Integrated sensor row addressing 78 and column detection circuits 80 may further be implemented in thin film electronics for the addressing and readout of the sensor circuitry in each array element.

A serial interface 82 may also be provided to process a serial input data stream and facilitate the programming of the required voltages to the element electrodes 48 in the array 50. A voltage supply interface 84 provides the corresponding supply voltages, top substrate drive voltages, and other requisite voltage inputs as further described herein. A number of connecting wires 86 between the lower substrate 44 and external control electronics, power supplies and any other components can be made relatively few, even for large array sizes. Optionally, the serial data input may be partially parallelized. For example, if two data input lines are used the first may supply data for columns 1 to X/2, and the second for columns (1+X/2) to M with minor modifications to the column driver circuits 76. In this way the rate at which data can be programmed to the array is increased, which is a standard technique used in liquid crystal display driving circuitry.

Various methods of controlling an AM-EWOD device to sense droplets and perform desired droplet manipulations have been described. For example, US 2017/0056887 (Hadwen et al., published Mar. 2, 2017) describes the use of capacitance detection to sense dynamic properties of reagents as a way for determining the output of an assay.

FIG. 6 is a drawing depicting an array element including exemplary array element circuitry for an AM-EWOD device that embodies a previous design of Applicant. This basic circuit has three thin film transistors (TFTs T1, T2, and T3) and two capacitors (C1 and C2), and is associated with seven addressing lines. The $R_{drop}$ and $C_{drop}$ represent the resistance and capacitance across the device from the reference (top) electrode TP to the hydrophobic coating on which the droplet may sit, and any other insulator layers incorporated into the device are represented by the capacitance Cl. The values of $R_{drop}$ and $C_{drop}$ will vary based on the presence or absence of a droplet, as described above with respect to FIGS. 4A and 4B. Example AM-EWOD devices having this basis circuit design are described in Applicant's commonly assigned U.S. Pat. No. 8,653,832 (Hadwen et al., issued Feb. 18, 2014) and US 2018/0078934 (Hadwen et al., published Mar. 22, 2018).

The circuit of FIG. 6 generally is operated as follows. To program an array element by writing voltage data to said array element, the voltage to be programmed is loaded onto addressing line SL, and a pulse is applied to the gate line GL appropriate for the row being programmed. This turns on a drive transistor T1, and the circuit node connected to the electrode is charged to the programmed voltage. When GL is taken low, this voltage is preserved, stored on a storage capacitor C1. Typically, C1 is larger than the second or sensor capacitor C2 by at least about an order of magnitude. To perform sensing, in a reset step a reset transistor T2 is turned on by an RST signal, so the gate of a sensor readout transistor T3 charges to VCCA. In conventional configurations, VCCA is a reset potential chosen below the threshold voltage of T3 such that T3 remains off and any previous voltage is cleared. In a sensing step, the RST signal is set low so that the gate of sensor readout transistor T3 is not driven and an addressing line RWS is pulsed. For the duration of the RWS pulse, the electrode potential is perturbed to a higher voltage. The change in voltage achieved is principally a function of the ratio of capacitor C1 to the total capacitance at the electrode, which includes the load associated with whether the droplet is present or absent. The perturbation is coupled through the sensor capacitor C2 to the gate of T3, and transistor T3 is accordingly turned on to an extent determined by the amplitude of the pulse as coupled. A pixel voltage supply VPIX provides a voltage input so as to generate an output current through T3, which again will be dependent upon the voltage coupled to the gate of T3. The resultant current passes through T3 and is sunk down a sensor output column line COL, which may then be sensed by column detection circuitry at the bottom of the column (not shown).

The basic array element circuitry of FIG. 6 also can be modified as may be advantageous for certain applications or circumstances. FIG. 7 is a drawing depicting an array element including exemplary array element circuitry for an AM-EWOD device that embodies another previous design of Applicant. Comparable configurations are described in Applicant's commonly assigned US 2017/0076676 (Hadwen, published Mar. 16, 2017). In this implementation, the three transistor/two capacitor sensing circuitry of U.S. Pat. No. 8,653,832 can be combined with a two transistor/one capacitor array element actuation circuit. This implementation thus contains a total of five transistors, three capacitors, and nine addressing lines, with additional actuation circuitry being combined with impedance sensor circuitry as described. Addressing lines control access to an additional dynamic RAM memory circuit comprising the transistor T4 and a capacitor C3. The voltage programmed to this capacitor in turn controls whether or not the input signal from the actuation circuit is connected through to the array element electrode depending upon whether the voltage written to C3 is sufficient to turn on T5. The input signal SEL may further be used to isolate the element electrode from the actuation signal when the sensing function is being operated. In other respects, the sensing function may proceed comparably as described with respect to FIG. 6.

In a variation of the above sensing circuitry, the array element does not contain a row select line (the row addressing line named RWS in U.S. Pat. No. 8,653,832) or the capacitor C1 (named Cs in U.S. Pat. No. 8,653,832) which is connected between the RWS line and the element electrode in U.S. Pat. No. 8,653,832. In a similar sensing operation, however, the gate of the reset transistor T2 again is turned on by a signal RST, so the gate of a sensor readout transistor T3 likewise charges to VCCA. Again, in conventional configurations the reset potential VCCA is chosen below the threshold voltage of T3 such that T3 remains off and any previous voltage is cleared.

FIG. 8 is a drawing depicting an array element including exemplary array element circuitry for an AM-EWOD device that embodies another previous design of Applicant. Comparable configurations are described in Applicant's commonly assigned U.S. Pat. No. 8,173,000 (Hadwen et al., issued May 8, 2012). In this implementation, the three transistor/two capacitor impedance sensor circuitry of U.S. Pat. No. 8,653,832 can be combined with an actuation circuit and memory function incorporating an SRAM cell. The memory function includes an n-type switch transistor T4, a p-type switch transistor T5, a first inverter I1, and a second inverter I2. This implementation further includes an inversion circuit including two analogue switches S1 and S2. The capacitances Ch and Cl refer to capacitances of the device layers including the hydrophobic coatings and insulator layers. As described in U.S. Pat. No. 8,173,000, the memory function is written by applying a voltage pulse so as to turn on one of the switch transistors T4 or T5. The input voltage thus written is supplied to the inversion circuit. The operation of the inversion circuit provides an inverted memory node signal that can be obtained from connection to the node between the two inverters of the SRAM cell. In other respects, the sensing function may proceed comparably as described with respect to FIGS. 6 and 7.

Even with the advantages of TFT based AM-EWOD devices, analytical challenges remain. In particular, conventional configurations of array element circuits lack sufficient sensitivity to small capacitances for sensing under certain circumstances. This results in large part from the gate of the sensor readout transistor initially being at a low voltage, resulting in the sensor readout transistor being in the "off" state, during the reset operation. Accordingly, small capacitance variations that occur during the sensing operation do not result in a sufficiently large change to the output signal as any small changes to the gate voltage of T3 will not take the transistor out of the "off" state. Circumstances such as oil filling and the presence of air bubbles result in signal output current swings from the sensor readout transistor comparable to the system noise (of the order of about 20 mV of the final device output voltage), and thus such an output signal is difficult to detect for sensing purposes. For example, U.S. Pat. No. 8,872,527 (Sturmer et al., issued Oct. 18, 2014) attempts to detect microfluidic properties, including the presence of air bubbles, based on capacitance differences between air and the oil.

SUMMARY OF INVENTION

A more sensitive impedance sensing circuit would allow a more reliable detection of oil filling and air bubbles, as well as other conditions that are associated with small capacitance variations, based on the output from the sensor readout transistor. For example, this further could enable detection of contamination on the device surface and potentially facilitate electronic measurement of the height of the cell gap in which the droplets are located, and be applicable to other device and droplet conditions as well.

The present invention, therefore, pertains to enhanced configurations of array element circuitry in AM-EWOD devices, which realize improved sensitivity of the impedance sensing circuitry within the array elements. The sensing circuitry is improved by enhancing the sensitivity to very small capacitance variations, such as for example capacitances associated with oil filling and the presence of air bubbles, or as may be suitable to perform electronic measurement of the height of the cell gap between the lower and upper substrates, and other applications. In the array element circuitry in accordance with embodiments of the present invention, small changes of capacitance can be transduced into a higher amplified output current from the sensor readout transistor to permit improved sensing of conditions that are associated with small capacitance variations.

To accomplish such enhanced sensitivity, a pre-charging effect is applied whereby the sensor readout transistor in an array element being sensed is altered to turn on the sensor readout transistor during a sensing phase. This differs from conventional configurations in which the sensor readout transistor is reset to an off state at the beginning of the sensing phase prior to applying the perturbation voltage. For example, a positive pre-charging voltage may be applied across the gate and source of the sensor readout transistor to turn said transistor on, or a negative voltage may be applied across the gate and source of a p-type sensor readout transistor to turn on the sensor readout transistor.

During a sensing operation, an actuation and memory portion of the array element circuitry is isolated from the sensing circuitry, and the voltage applied to the array element circuitry, such as for example to the reference (top) electrode of the EWOD device, is perturbed. The perturbation is coupled through some circuit elements to the sensing circuitry, in a manner that will differ depending upon the presence or absence of a droplet or oil at the array element. The perturbation ultimately is coupled to perturb the voltage at the gate of the sensor readout transistor. Because of the pre-charging effect applied to turn on the sensor readout transistor during the sensing phase, the transistor will be operating in its linear region, where changes in the gate voltage are reflected in corresponding changes in its drain current. This differs from when the transistor gate voltage is not above the "turn-on voltage" and changes in the gate voltage are not reflected in significant changes in the drain current. Therefore, the pre-charging effect means a small change of the gate voltage due to a very small capacitance change results in large effects on the output current from the sensor readout transistor, thereby providing a more sensitive sensing circuitry. In general, the pre-charging effect operates to increase the magnitude of the potential difference between the gate and source of the sensor readout transistor, thereby increasing the effect of a voltage perturbation at the gate on the resultant output current from the sensor readout transistor.

In exemplary embodiments, the pre-charging effect is achieved by applying a pre-charging voltage to the gate of the sensor readout transistor to turn on the sensor readout transistor during the sensing phase in combination with applying the perturbation voltage. In exemplary embodiments, the pre-charging effect is performed by replacing the conventional power supply line (VCCA) by a row addressing line signal, configured to have a different potential for the row being sensed as compared to the potential for the other rows in the array. For the row being sensed, and specifically for the sensed row only, the gate of the sensing readout transistor is pre-charged by the row addressing signal (PC: "pre-charge") to a condition in which the sensor readout transistor is turned on, and thus a relatively small voltage change at the gate of the sensor readout transistor will produce a larger change in the output current as compared to conventional configurations. When a reset signal line is pulsed to the gate of the reset transistor to turn on the reset transistor, the voltage input PC from the row addressing line is applied through the reset transistor to the gate of the sensor readout transistor to turn the transistor on, thereby producing a larger change in output current from the sensing circuitry when the PC voltage is disconnected from the gate of the sensor readout transistor and the reference electrode is perturbed. The gates of the sensor readout transistors on all the other rows not being sensed are maintained at a different, low potential so that the sensor readout transistors in the rows not being sensed remain turned off. As a result, the current through the output column line only derives from the row being sensed.

Alternative embodiments employ different circuit configurations and operations to perform the referenced pre-charging to turn on the sensor readout transistor. For example, in exemplary embodiments a boost capacitor is connected between a pixel input voltage VPIX and the gate of the sensor readout transistor, whereby the pre-charging effect is performed by coupling the pixel input voltage through the boost capacitor to the gate of the sensor readout transistor to turn on the transistor. In another embodiment, the sensor readout transistor is configured as a p-type transistor, and the pre-charging effect is performed by applying an input voltage to the gate of the sensor readout transistor to turn off the sensor readout transistor, and then adjusting the pixel input voltage to increase the magnitude of the potential difference between the gate and source of the sensor readout transistor, i.e., the pixel input voltage VPIX is adjusted to turn the sensor readout transistor "on". In another embodiment the pre-charging effect may be applied at the same time as the perturbation voltage rather than before, also leading to the sensor readout transistor becoming "more turned on". In yet another embodiment the pre-charging effect may be applied after the perturbation voltage has begun, leading to the same result of the sensor readout transistor becoming "more turned on".

The circuit configurations of the present invention have an advantage over conventional configurations in that the sensor output through the sensor readout transistor of the row being sensed is highly sensitive to small capacitance changes at the electrode. Applications for the increased sensitivity include detecting the presence or absence of oil in the EWOD device, which is useful when filling the device and detecting air bubbles, or detecting conductivity changes at the hydrophobic surfaces, which may occur for example due to contaminating biomolecule adsorption, and others. Output current changes associated with such conditions are easily detectable, allowing output voltages from the chip that would previously be 5 mV or lower up to a maximum of 5V, with around 500 voltage levels between them, to be easily detected. Detection of such conditions could have value as a quality check in all EWOD device applications, especially at high temperatures. In a feedback mode, this could be used to report an error and/or to implement a corrective action.

An aspect of the invention, therefore, is an AM-EWOD device having enhanced array element circuitry that employs a pre-charging operation during a sensing operation, which turns on the sensor readout transistor in combination with applying a perturbed voltage, thereby increasing the effect of the perturbed voltage on the output current for sensing. In exemplary embodiments, an AM-EWOD device includes a plurality of array elements arranged in an array of rows and columns, each of the array elements including array element circuitry, an element electrode, and a reference electrode. The array element circuitry includes actuation circuitry configured to apply actuation voltages to the element and reference electrodes for actuating the array element, and impedance sensor circuitry configured to sense impedance at the array element electrode to determine a droplet or device property at the array element, the impedance sensor circuitry comprising a sensor capacitor and a sensor readout transistor that outputs an output current for sensing. The sensor capacitor is electrically connected to a gate of the sensor readout transistor such that during a sensing phase a voltage perturbation is coupled through the sensor capacitor (and possibly other circuit elements) to the gate of the sensor readout transistor. The impedance sensor circuitry further comprises a pre-charging element that operates to turn on the sensor readout transistor during the sensing phase in combination with coupling of the voltage perturbation, thereby increasing the effect of the voltage perturbation on the output current.

Embodiments of the pre-charging element include, for example, a reset transistor that applies a pre-charging voltage to the gate of the sensor readout transistor to turn on the sensor readout transistor, or a boost capacitor that applies a pre-charging voltage to the gate of the sensor readout transistor to turn on the sensor readout transistor. Alternatively, the pre-charging element may be configured as a p-type sensor readout transistor and a reset transistor connected to a reset voltage address line, wherein a reset voltage through the reset transistor resets the gate of the p-type sensor readout transistor, and a voltage input to the source of the p-type sensor readout transistor is adjusted to increase the magnitude of a potential difference between the gate and source of the p-type sensor readout transistor and turn it on.

Another aspect of the invention is the method of operating an AM-EWOD of any of the embodiments in which a pre-charging operation is performed during a sensing operation, which turns on the sensor readout transistor in combination with applying a perturbed voltage, thereby increasing the effect of the perturbed voltage on the output current for sensing. In exemplary embodiments, the method includes performing a pre-charging operation to an array element being sensed that increases a magnitude of a potential difference between the gate and a source of the sensor readout transistor of the array element being sensed sufficiently to turn on the sensor readout transistor of the array element being sensed; perturbing a voltage applied to the array element being sensed and coupling the perturbed voltage through the sensor capacitor to the gate of the sensor readout transistor of the array element being sensed; and measuring an output current from the sensor readout transistor of the array element being sensed to measure the device, droplet or oil property at the array element being sensed.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto. Features that are described and/or illustrated with respect to one embodiment may be used in the same way or in a similar way in one or more other embodiments and/or in combination with or instead of the features of the other embodiments.

BRIEF DESCRIPTION OF DRAWINGS

FIG. 1 is a drawing depicting an exemplary EWOD based microfluidic system.

FIG. 2 is a drawing depicting an exemplary AM-EWOD device in a perspective view.

FIG. 27 is a drawing depicting an exemplary operation that employs perturbing and sensing over multiple array elements.

DESCRIPTION OF EMBODIMENTS

Figure 3:
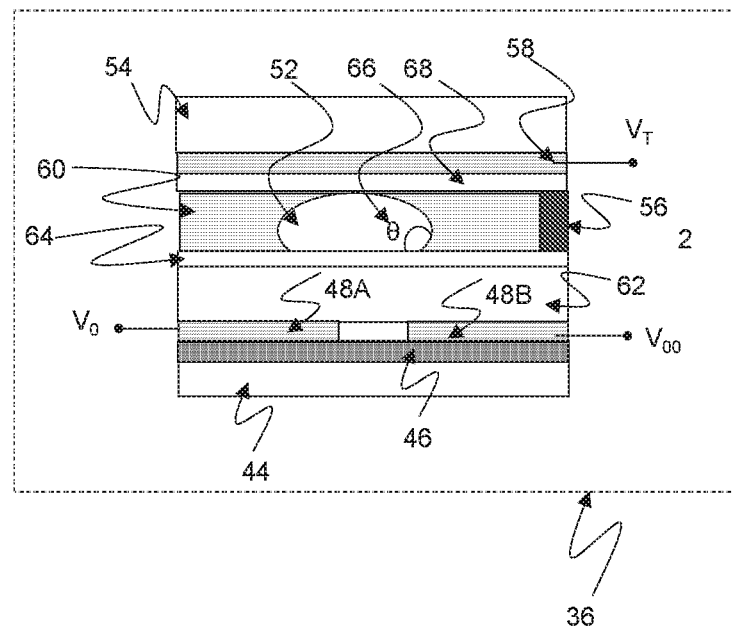
FIG. 3 is a drawing depicting a cross section through some of the array elements of the exemplary AM-EWOD device of FIG. 2.

Embodiments of the present invention will now be described with reference to the drawings, wherein like reference numerals are used to refer to like elements throughout. It will be understood that the figures are not necessarily to scale.

The present invention pertains to enhanced configurations of array element circuitry in AM-EWOD devices, which realize improved sensitivity of the impedance sensing circuitry within the array elements. The sensing circuitry is improved by enhancing the sensitivity to small capacitance changes, such as for example capacitances associated with oil filling and the presence of air bubbles, or as may be suitable to perform electronic measurement of the height of the cell gap in which the droplets may be received, and other applications. In the array element circuitry in accordance with embodiments of the present invention, small changes of capacitance can be transduced into a higher amplified output current from the sensor readout transistor.

To accomplish such enhanced sensitivity, a pre-charging effect is applied whereby a sensor readout transistor in an array element being sensed is altered to turn on the sensor readout transistor during a sensing phase. For example, a positive pre-charging voltage may be applied across the gate and source of the n-type sensor readout transistor to turn on the sensor readout transistor, or a negative voltage may be applied across the gate and source of a p-type sensor readout transistor to turn on the sensor readout transistor. A voltage perturbation is coupled through to the sensing circuitry, in a manner that will differ depending upon the presence or absence of a droplet or oil at the array element. The voltage perturbation ultimately is coupled to perturb the voltage at the gate of the sensor readout transistor. This coupling is generally through a capacitor, but the coupling could also be through a capacitor and other circuit elements in series with the capacitor, such as a transistor in a conducting state or any other circuit element that is conducting. Because of the pre-charging effect applied to turn on the sensor readout transistor during the sensing phase, an output change due to a very small capacitance change results in larger effects on the output current from the sensor readout transistor, thereby providing a more sensitive sensing circuitry. In general, the pre-charging effect operates to increase the magnitude of the potential difference between the gate and source of the sensor readout transistor, thereby increasing the effect of a voltage perturbation at the gate on the resultant output current from the sensor readout transistor.

An aspect of the invention, therefore, is an AM-EWOD device having enhanced array element circuitry that employs a pre-charging operation during a sensing operation, which turns on the sensor readout transistor in combination with applying a perturbed voltage, thereby increasing the effect of the perturbed voltage on the output current for sensing. In exemplary embodiments, an AM-EWOD device includes a plurality of array elements arranged in an array of rows and columns, each of the array elements including array element circuitry, an element electrode, and a reference electrode. The array element circuitry includes actuation circuitry configured to apply actuation voltages to the element and reference electrodes for actuating the array element, and impedance sensor circuitry configured to sense impedance at the array element electrode to determine a droplet, oil or device property at the array element, the impedance sensor circuitry comprising a sensor capacitor and a sensor readout transistor that outputs an output current for sensing. The sensor capacitor is connected to a gate of the sensor readout transistor such that during a sensing phase a voltage perturbation is coupled through the sensor capacitor to the gate of the sensor readout transistor. The impedance sensor circuitry further comprises a pre-charging element that operates to turn on the sensor readout transistor during the sensing phase in combination with coupling of the voltage perturbation, thereby increasing the effect of the voltage perturbation on the output current.

Figure 9:
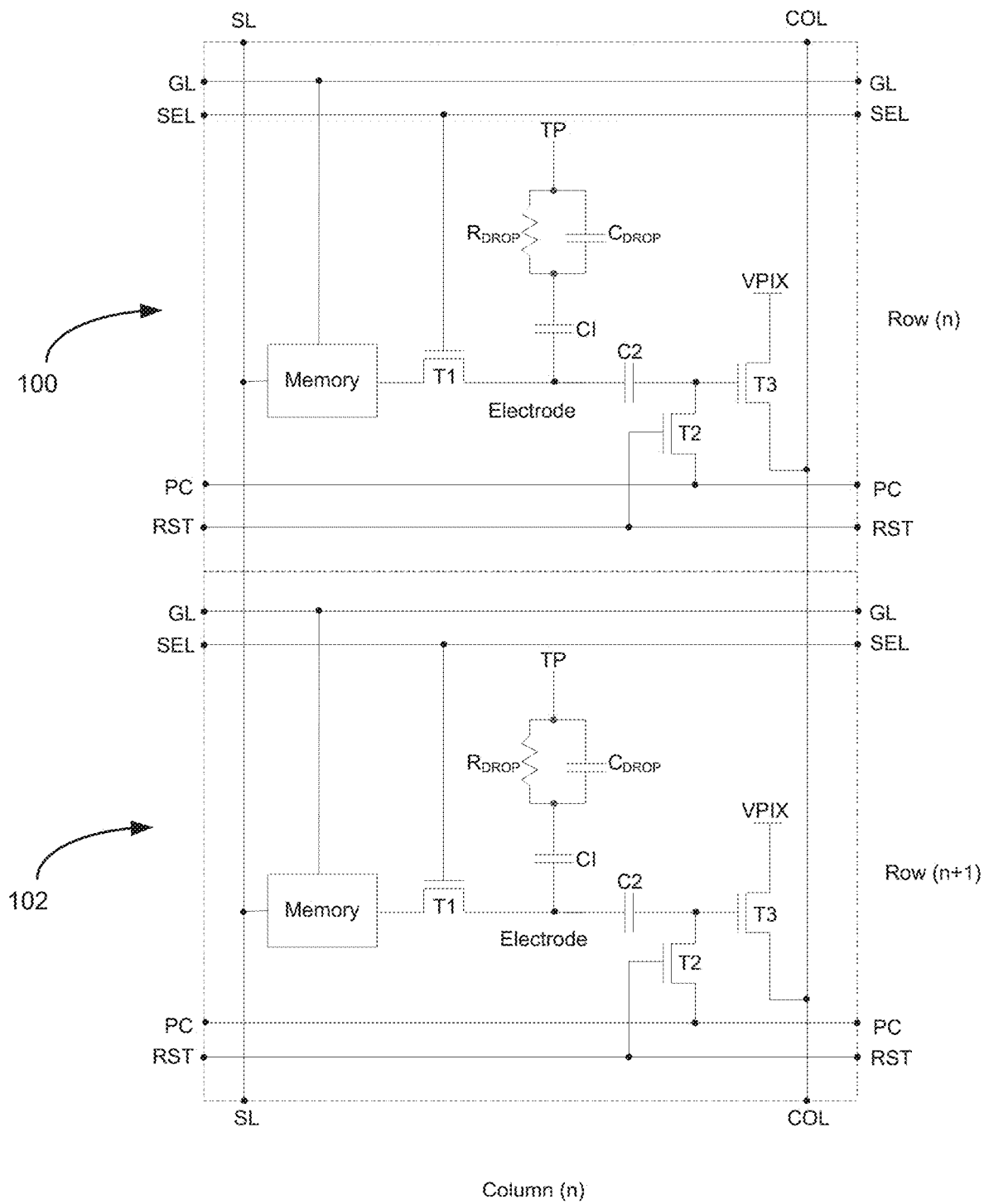
FIG. 9 is a drawing depicting a plurality of array elements including exemplary array element circuitry for an AM-EWOD device, which employs applying a pre-charging voltage to pre-charge a sensor readout transistor.
Figure 10:
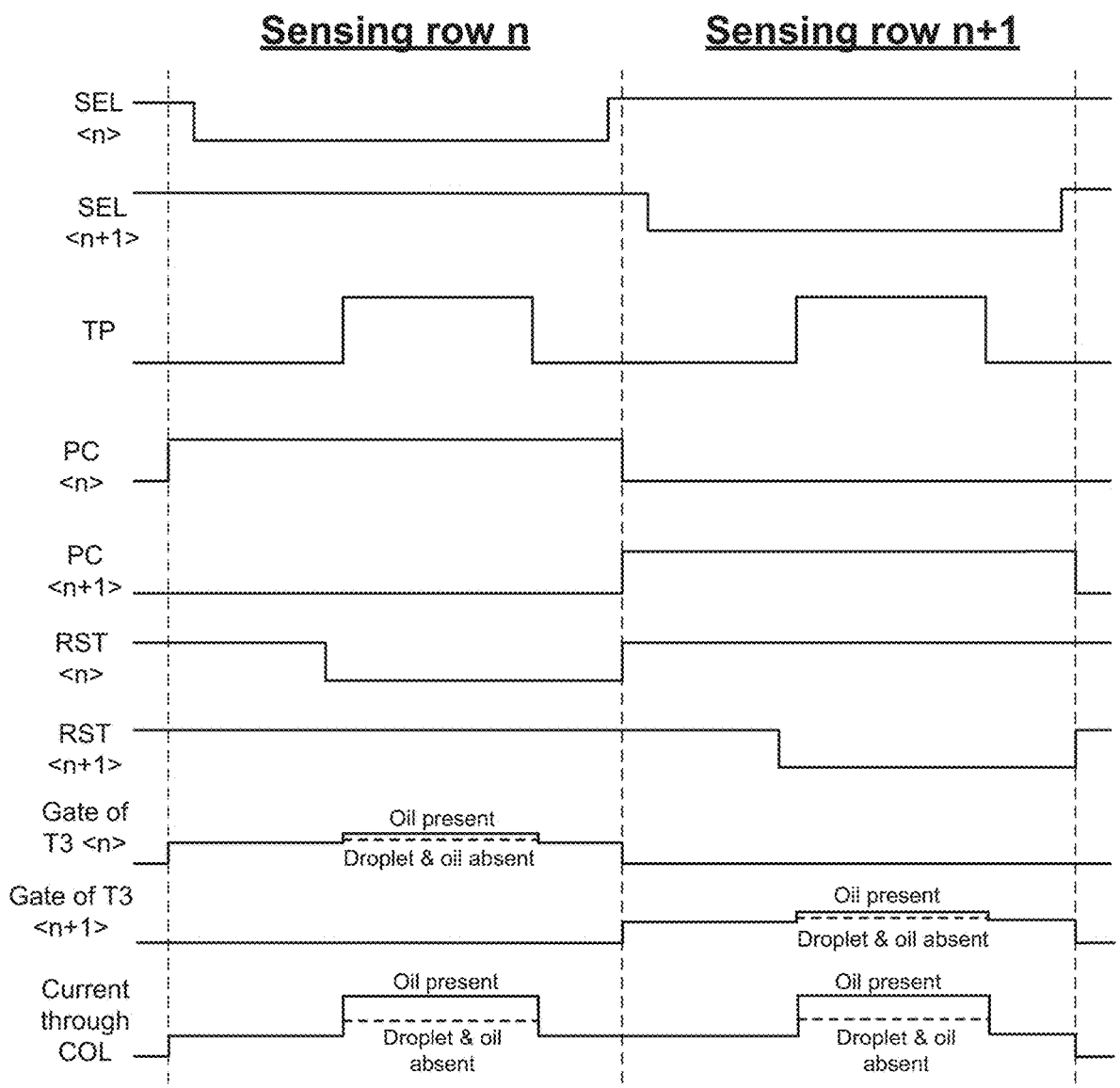
FIG. 10 is a timing diagram that illustrates the operation of the embodiment of FIG. 9.

In exemplary embodiments, the pre-charging effect is achieved by applying a pre-charging voltage to the gate of the sensor readout transistor to turn on the sensor readout transistor during the sensing phase prior to applying the perturbing voltage. As an example of such embodiments, FIG. 9 is a drawing depicting a plurality of array elements including exemplary array element circuitry for an AM-EWOD device in accordance with embodiments of the present invention. The embodiment of FIG. 9 provides an enhanced circuit configuration that improves over the configuration depicted in FIGS. 6 and 7. FIG. 10 is a timing diagram that illustrates the operation of the embodiment of FIG. 9. FIG. 9 depicts a pair of array elements in a common Column(n) including a first array element 100 and a second array element 102 positioned in adjacent rows, respectively Row(n) and Row(n+1). Generally, the embodiment of FIG. 9 is a modification of the circuit configuration of FIGS. 6 and 7, with the reset transistor T2 being connected to a row addressing line (PC) and reset line RST so as to be able to apply a pre-charging voltage to the sensor readout transistor T3.

Figure 4A:
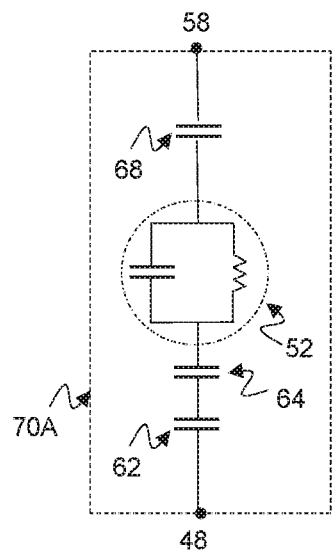
FIG. 4A is a drawing depicting a circuit representation of the electrical load presented at the element electrode when a liquid droplet is present.
Figure 4B:
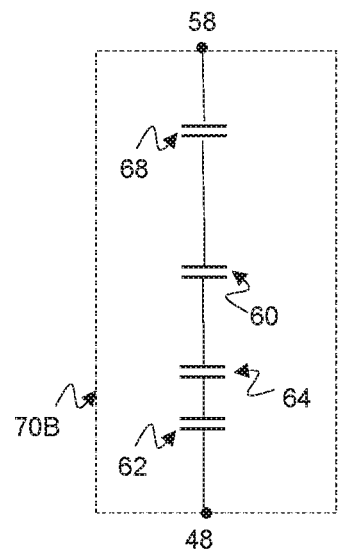
FIG. 4B is a drawing depicting a circuit representation of the electrical load presented at the element electrode when no liquid droplet is present.
Figure 5:
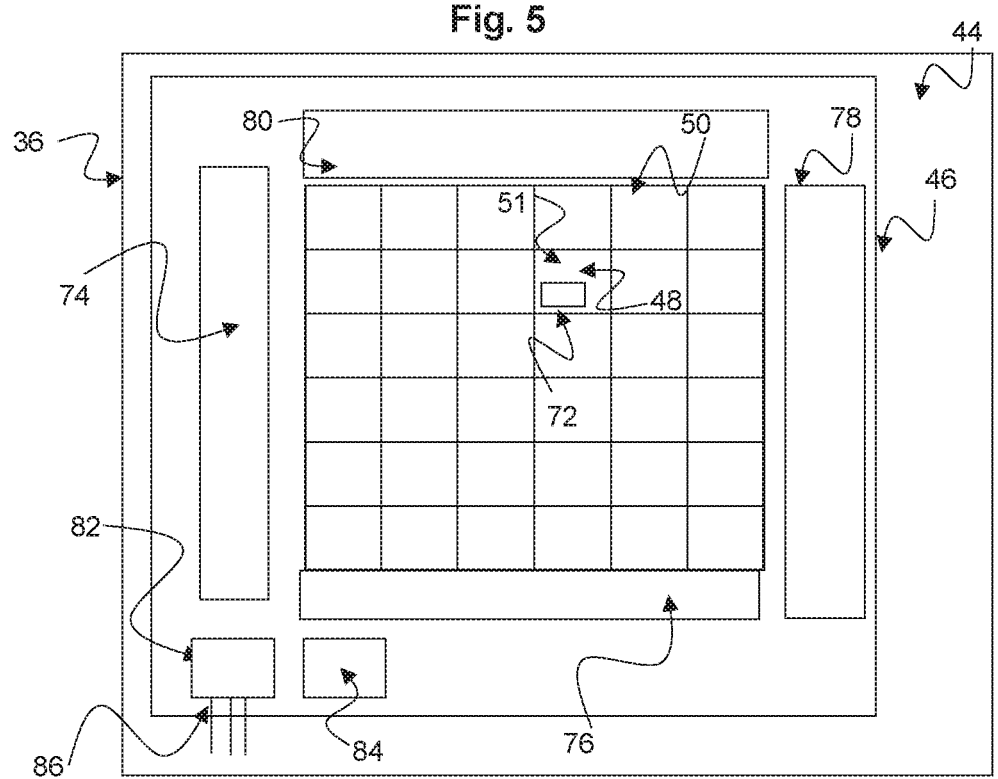
FIG. 5 is a drawing depicting an exemplary arrangement of thin film electronics in the exemplary AM-EWOD device of FIG. 2.

Referring to FIG. 9 in combination with the timing diagram of FIG. 10, programming and sensing proceeds as follows. Similarly as described with respect to FIG. 6, this basic circuit for impedance sensing has three thin film transistors (TFTs T1, T2, and T3) and a sensor capacitor C2 (this embodiment employs the variation in which the additional capacitor C1 connected to the RWS line is omitted). The $R_{drop}$ and $C_{drop}$ represent the resistance and capacitance across the device from the reference (top) electrode TP to the hydrophobic coating on which the droplet may sit. The capacitance of lower device components, including the hydrophobic coating and any other insulator layers incorporated into the device, are represented by the capacitance CI. The values of $R_{drop}$ and $C_{drop}$ will vary based on the presence or absence of a droplet, as described above with respect to FIGS. 4A and 4B.

Figure 6:
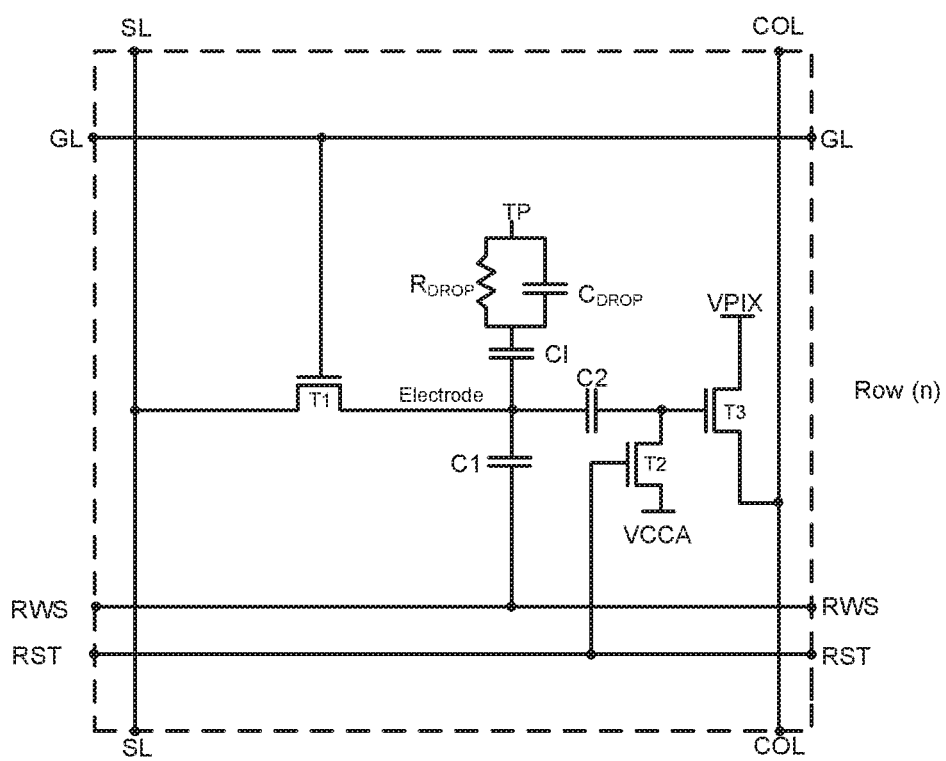
FIG. 6 is a drawing depicting an array element including exemplary array element circuitry for an AM-EWOD device that embodies a previous design of Applicant.
Figure 7:
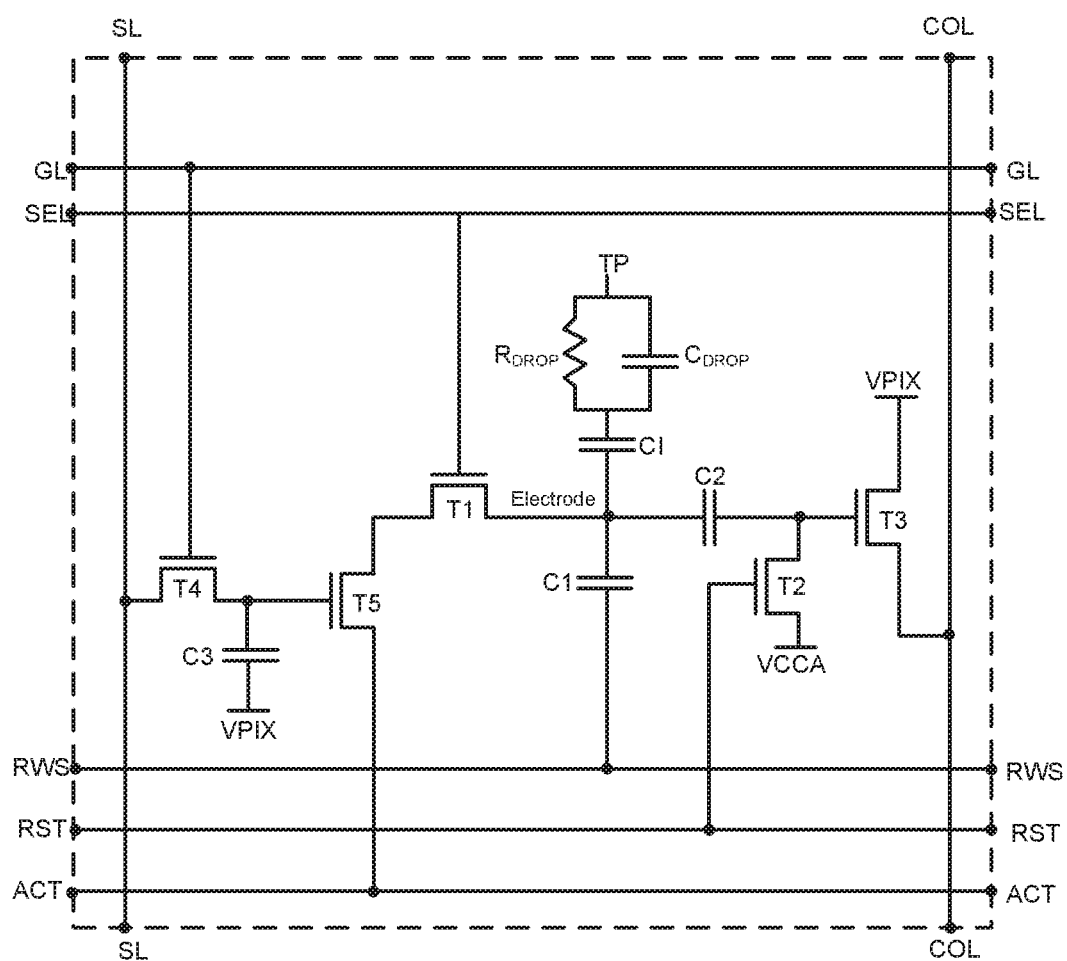
FIG. 7 is a drawing depicting an array element including exemplary array element circuitry for an AM-EWOD device that embodies another previous design of Applicant.

Comparing FIG. 9 to the previous array design of FIG. 6, the pre-charging effect is achieved by replacing the conventional power supply line VCCA by a row addressing line signal PC (PC denotes "pre-charging" as used herein), which is configured to have a different potential for the row being sensed as compared to the potential for the other rows in the array. For the row being sensed, and specifically for the sensed row only, the gate of the sensing readout transistor T3 is pre-charged by PC to a condition in which the sensing readout transistor is turned on, and thus a relatively small voltage change at the gate of the sensor readout transistor will produce a larger change in the output current as compared to conventional configurations. When a reset signal line RST, applied to the gate of the reset transistor T2, is held high to turn on the reset transistor, the voltage input from the row addressing line PC is applied through the reset transistor T2 to the gate of the sensor readout transistor T3, wherein PC switches from a low voltage to a voltage sufficient to turn on T3. The gate of T3 is effectively pulsed with the PC voltage. This allows a larger change in output current to be produced from the sensing circuitry when the reference electrode is perturbed. The gates of the sensor readout transistors T3 on all the other rows not being sensed are maintained at a different, low potential so that the sensor readout transistors T3 in the rows not being sensed remain turned off. This is achieved by keeping the row addressing line PC low on every other row and holding the reset signal line RST high, so that the gate of T3 is held at the low PC potential. As a result, the current through the output column line only derives from the row being sensed.

Referring to the circuit configuration of FIG. 9 in combination with the timing diagram of FIG. 10, programming and actuation occurs comparably as in the previous design of FIG. 6. To simplify the illustration, the actuation circuit in FIG. 9 is represented by the memory block. To program a given array element 100 or 102 by writing voltage data to said array element, the actuation voltage to be programmed is loaded onto an addressing line SL, and a pulse is applied to the gate line GL appropriate for the row being programmed, which in this example is either Row(n) or Row (n+1). For actuation, a select SEL is applied to turn on T1 in the selected row, and the circuit node connected to the electrode is charged to the programmed voltage.

To perform sensing of a given row, say Row(n) in this example, the SEL(n) line is taken low to isolate the actuation circuit by turning off T1 for Row(n). In a reset step the reset transistor T2 of said row is turned on by a reset signal RST(n). For the sensing row, therefore, the pre-charging row addressing line PC(n) is applied to the gate of the sensor readout transistor. For sensing, as shown in the timing diagram, the signal PC(n) is taken high, and specifically to a voltage sufficient to turn on the sensor readout transistor T3, so the gate of sensor readout transistor T3 charges to PC(n). Again, PC(n) is sufficiently high to turn on T3, and thus a current will flow through T3 due to application of the pixel voltage supply VPIX, with the current being dependent upon the voltage at the gate of T3. As the capacitor C2 also is connected to the gate of T3, the pre-charging voltage PC(n) also is applied to the capacitor C2. The reset signal RST(n) is then taken low to disconnect PC(n) from the gate of T3. The voltage is stored on capacitor C2, keeping T3 in an on-state. Following the pre-charging, the reference (top) electrode potential for array element 100—TP—is perturbed to a higher voltage. The perturbation is coupled through the sensor capacitor C2 of Row(n) to the gate of the sensor readout transistor T3, and the change in the voltage at the gate of transistor T3 alters the current flow through T3 as generated from the pixel voltage supply VPIX. The resultant current from array element 100 passes through T3 and is sunk down the output line COL, which may then be sensed by column detection circuitry at the bottom of the column (not shown). The pre-charging effect applied to the gate of T3 operates to increase the potential difference between the gate and source of the sensor readout transistor, thereby increasing the effect of a small voltage perturbation at the gate on the resultant output current from the sensor readout transistor. This is shown particularly in the timing diagram of FIG. 10.

In this example, each row is sensed independently of other rows. Accordingly, as shown in the timing diagram of FIG. 10, while Row(n) is being sensed, the select line for Row (n+1), SEL (n+1), remains high so that the actuation circuit remains electrically connected to the element (bottom) electrode of the array element. Additionally, the reset signal RST(n+1) remains high so that the reset transistor T2 remains turned on and applies the PC(n+1) signal to the gate of sensor readout transistor T3. However, the pre-charging row addressing line PC(n+1) is kept low so as to make sure that T3 of Row(n+1) is turned off at all times while Row(n) is being sensed.

The sensing operation is then repeated for Row(n+1), which is performed by pre-charging the sensor readout transistor for Row(n+1). Accordingly, the SEL(n+1) line is taken low to isolate the actuation circuit by turning off T1 for Row(n+1). In a reset step the reset transistor T2 of said row is turned on by a reset signal RST(n+1). For the sensing row, therefore, the pre-charging row addressing line PC(n+1) is applied to the gate of the sensor readout transistor T3. In particular, the signal PC(n+1) is taken high, and specifically to a voltage sufficient to turn on the sensor readout transistor T3, so the gate of sensor readout transistor T3 charges to PC(n+1). Again, PC(n+1) is sufficiently high to turn on T3, and thus a current will flow through T3 due to application of the pixel voltage supply VPIX, with the current being dependent upon the voltage at the gate of T3. As the capacitor C2 also is connected to the gate of T3, the pre-charging voltage PC(n+1) also is applied to the capacitor C2. The reset signal RST(n+1) is then taken low to disconnect PC(n+1) from the gate of T3. The voltage is stored on capacitor C2, keeping T3 in an on-state. In combination with the pre-charging, the reference electrode potential for array element 102—TP—is perturbed to a higher voltage. The perturbation is coupled through the sensor capacitor C2 of Row(n+1) to the gate of the sensor readout transistor T3, and the change in the voltage at the gate of transistor T3 alters the current flow through T3 as generated from the pixel voltage supply VPIX. The resultant current from array element 102 passes through T3 and is sunk down the output line COL, which may then be sensed by column detection circuitry at the bottom of the column (not shown). Again, the pre-charging effect applied to the gate of T3 operates to increase the potential difference between the gate and source of the sensor readout transistor, thereby increasing the effect of a small voltage perturbation at the gate on the resultant output current from the sensor readout transistor. This is also shown particularly in the timing diagram of FIG. 10.

For independent sensing, while Row(n+1) is being sensed, now the select line for Row(n), SEL(n), remains high so that the actuation circuit remains electrically connected to the element (bottom) electrode of the array element 100. Additionally, the reset signal for Row(n), RST(n), remains high so that the reset transistor T2 remains turned on and applies the PC(n) signal to the gate of sensor readout transistor T3. However, the pre-charging row addressing line PC(n) is kept low so as to make sure that T3 of Row(n) is turned off at all times while Row(n+1) is being sensed.

As seen in the timing diagram of FIG. 10, the level of the voltage at the gate of the sensor readout transistor T3, and thus the resultant current sunk down the output line COL, is dependent upon whether a droplet is present or absent or whether oil is present or absent. For each array element 100 and 102, therefore, the presence or absence of a droplet or oil is sensed.

In addition, the degree of sensitivity is enhanced by the pre-charging operation applied to turn on the sensor readout transistor T3 during the sensing phase, and in combination applying the perturbation voltage. The circuit configurations of the present invention thus have an advantage over conventional configurations in that the sensor output through the sensor readout transistor of the row being sensed is highly sensitive to small capacitance variations at the electrode. Applications for the increased sensitivity include detecting the presence or absence of oil in the EWOD device, which is useful when filling the device and detecting air bubbles. Additional uses include detecting conductivity changes at the hydrophobic surfaces, which may occur for example due to contaminating biomolecule adsorption or charge accumulation. For example, output changes that would previously be 5 mV or lower associated with oil filling, air bubbles, surface contamination, and the like are easily detectable. Small capacitance changes generally may be associated with ion barrier failure, whereby properties of a given device layer may vary unacceptably across multiple array elements. Small variations in capacitance also may be used to detect the height of the cell gap in which the droplets are inputted, which can permit a calibration operation directed to different device cartridge types. Relatedly, the drive transistor TFT transfer curve can be measured as part of a calibration operation.

Detection of such device conditions could have value as a quality check in all EWOD device applications, especially at high temperatures. In a feedback mode, the increased sensitivity of the sensor readout transistor could be used to report an error and/or to implement a corrective action. In addition, the sensitivity may be adjusted for reduced sensitivity in response to atypically large output signals. Such operation may be useful to distinguish between large output signals that otherwise may fully saturate the output.

In addition to device properties, sensing small voltage output changes that result from small capacitance variations may be used in certain droplet sensing operations. Examples include (without limitation) measuring low-conductivity droplets that tend to be difficult to sense; sensing merging droplets; sensing when droplets come in contact to form a droplet interface bilayer (i.e., a boundary is shared between two droplets); detecting beads or cells that are substantially smaller than typical droplets, and therefore tend to generate a smaller output sense signal; and detecting floating droplets that are out of contact with the array element (bottom) electrode.

Figure 11:
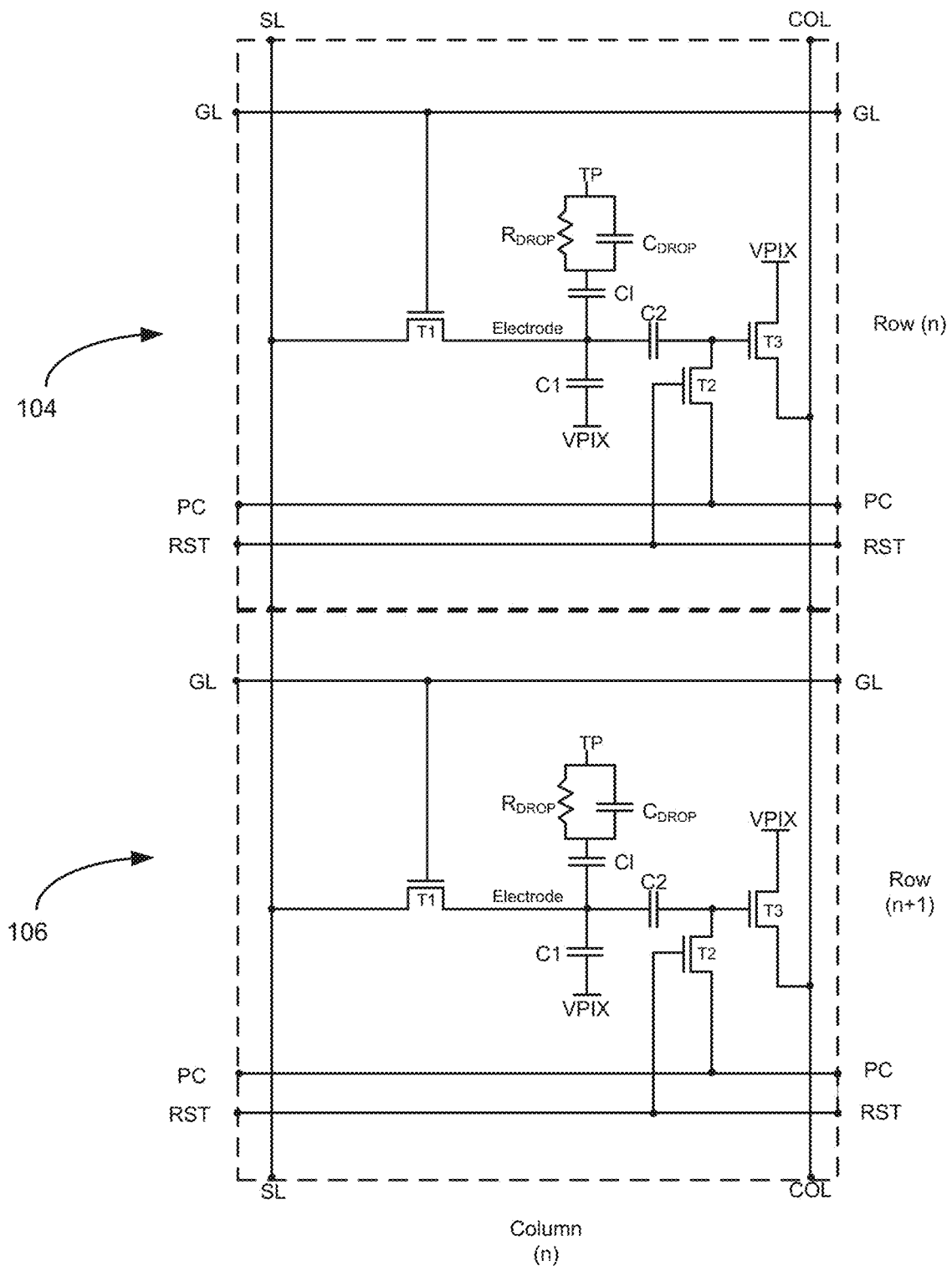
FIG. 11 is a drawing depicting a plurality of array elements including exemplary array element circuitry for an AM-EWOD device, which is a variation of FIG. 9 employing an additional storage capacitor.
Figure 12:
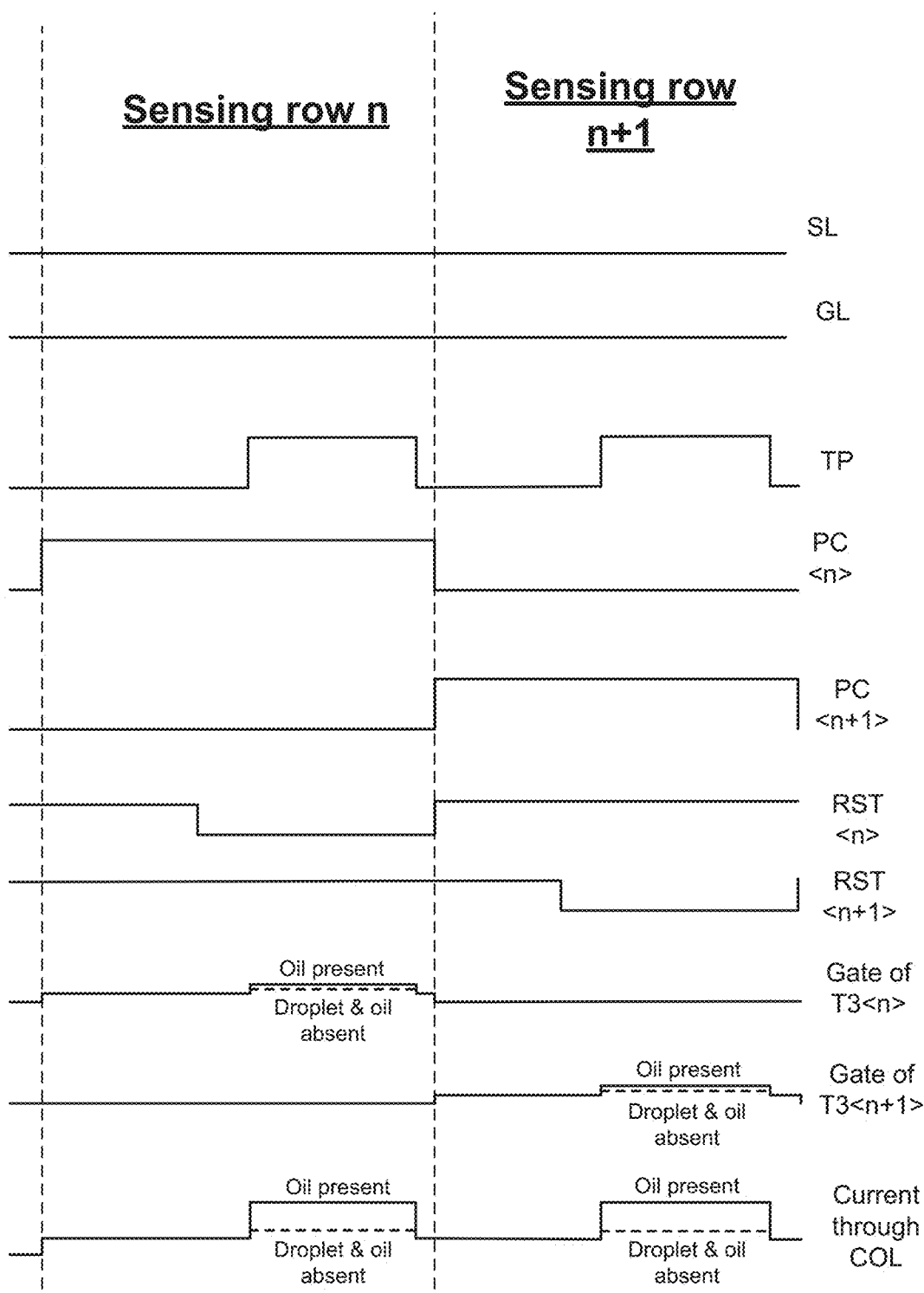
FIG. 12 is a timing diagram that illustrates the operation of the embodiment of FIG. 11.

Variations on the configuration of FIG. 9 may be employed to provide for a different manner of pre-charging and associated actuation and sensing operations. For example, FIG. 11 is a drawing depicting a plurality of array elements 104 and 106 including another exemplary array element circuitry for an AM-EWOD device in accordance with embodiments of the present invention. FIG. 12 is a timing diagram that illustrates the operation of the embodiment of FIG. 11. This embodiment is more precisely analogous to the circuit configuration of FIG. 6, in that the additional storage capacitor C1 is employed as a component of the array element circuitry.

Referring to the circuit configuration of FIG. 11 in combination with the timing diagram of FIG. 12, to program an array element by writing voltage data to said array element, comparably as in the circuit configuration of FIG. 6, the voltage to be programmed is loaded onto addressing line SL, and a pulse is applied to the gate line GL appropriate for the row being programmed. This turns on the drive transistor T1, and the circuit node connected to the electrode is charged to the programmed voltage. When GL is taken low, this voltage is preserved, stored on the storage capacitor C1. Typically, C1 is larger than the second or sensor capacitor C2 by at least about an order of magnitude.

Sensing then proceeds comparably as in the circuit configuration of FIG. 9. To perform sensing of a given row, say Row(n) in this example, the SL and GL lines are taken low to isolate the actuation circuit by turning off T1 for Row(n). In a reset step the reset transistor T2 of said row is turned on by a reset signal RST(n). For the sensing row, therefore, the pre-charging row addressing line PC(n) is applied to the gate of the sensor readout transistor T3. For sensing, as shown in the timing diagram, the signal PC(n) is taken high, and specifically to a voltage sufficient to turn on the sensor readout transistor T3, so the gate of sensor readout transistor T3 charges to PC(n). Again, PC(n) is sufficiently high to turn on T3, and thus a current will flow through T3 due to application of the pixel voltage supply VPIX, with the current being dependent upon the voltage at the gate of T3. As the capacitor C2 also is connected to the gate of T3, the pre-charging voltage PC(n) also is applied to the capacitor C2. The reset signal RST(n) is then taken low to disconnect PC(n) from the gate of T3. The voltage is stored on capacitor C2, keeping T3 in an on-state. Following the pre-charging, the reference (top) electrode potential for array element 104—TP—is perturbed to a higher voltage. The perturbation is coupled through the sensor capacitor C2 of Row(n) to the gate of the sensor readout transistor T3, and the change in the voltage at the gate of transistor T3 alters the current flow through T3 as generated from the pixel voltage supply VPIX. The resultant current from array element 104 passes through T3 and is sunk down the output line COL, which may then be sensed by column detection circuitry at the bottom of the column (not shown). The pre-charging effect applied to the gate of T3 operates to increase the potential difference between the gate and source of the sensor readout transistor, thereby increasing the effect of a voltage perturbation at the gate on the resultant output current from the sensor readout transistor.

In this example, each row again is sensed independently of other rows. Accordingly, while Row(n) is being sensed, the array element corresponding to Row(n+1) is held in a non-sensing state. The reset transistor T2 remains turned on and applies the PC signal of Row(n+1) to the gate of sensor readout transistor T3. However, the pre-charging row addressing line PC(n+1) is kept low so as to make sure that T3 of Row(n+1) is turned off at all times while Row(n) is being sensed.

The sensing operation is then repeated for Row(n+1), which is performed by pre-charging the sensor readout transistor for Row(n+1). Accordingly, the SL and GL lines are taken low to isolate the actuation circuit by turning off T1 for Row(n+1). In a reset step the reset transistor T2 of said row is turned on by a reset signal RST(n+1). For the sensing row, therefore, the pre-charging row addressing line PC(n+1) is applied to the gate of the sensor readout transistor T3. In particular, the signal PC(n+1) is taken high, and specifically to a voltage sufficient to turn on the sensor readout transistor T3, so the gate of sensor readout transistor T3 charges to PC(n+1). Again, PC(n+1) is sufficiently high to turn on T3, and thus a current will flow through T3 due to application of the pixel voltage supply VPIX, with the current being dependent upon the voltage at the gate of T3. As the capacitor C2 also is connected to the gate of T3, the pre-charging voltage PC(n+1) also is applied to the capacitor C2. The reset signal RST(n+1) is then taken low to disconnect PC(n+1) from the gate of T3. The voltage is stored on capacitor C2, keeping T3 in an on-state. Following the pre-charging, the reference electrode potential for array element 106—TP—is perturbed to a higher voltage. The perturbation is coupled through the sensor capacitor C2 of Row(n+1) to the gate of the sensor readout transistor T3, and the change in the voltage at the gate of transistor T3 alters the current flow through T3 as generated from the pixel voltage supply VPIX. The resultant current from array element 106 passes through T3 and is sunk down the output line COL, which may then be sensed by column detection circuitry at the bottom of the column (not shown). Again, the pre-charging effect applied to the gate of T3 operates to increase the potential difference between the gate and source of the sensor readout transistor, thereby increasing the effect of a voltage perturbation at the gate on the resultant output current from the sensor readout transistor.

In this example, each row again is sensed independently of other rows. Accordingly, while Row(n+1) is being sensed, the array element corresponding to Row(n) is held in a non-sensing state. The reset transistor T2 remains turned on and applies the PC(n) signal to the gate of sensor readout transistor T3. However, the pre-charging row addressing line PC(n) is kept low so as to make sure that T3 of Row(n) is turned off at all times while Row(n+1) is being sensed.

As seen in the timing diagram of FIG. 12, the level of the voltage at the gate of the sensor readout transistor T3, and thus the resultant current sunk down the output line COL, is dependent upon whether either a droplet or oil is present or absent. For each array element 104 and 106, therefore, the presence or absence of a droplet or oil is sensed. In addition, the degree of sensitivity is enhanced by the pre-charging operation applied to turn on the sensor readout transistor T3 during the sensing phase prior to applying the perturbation voltage, which has the numerous advantages described above over conventional configurations.

Figure 13:
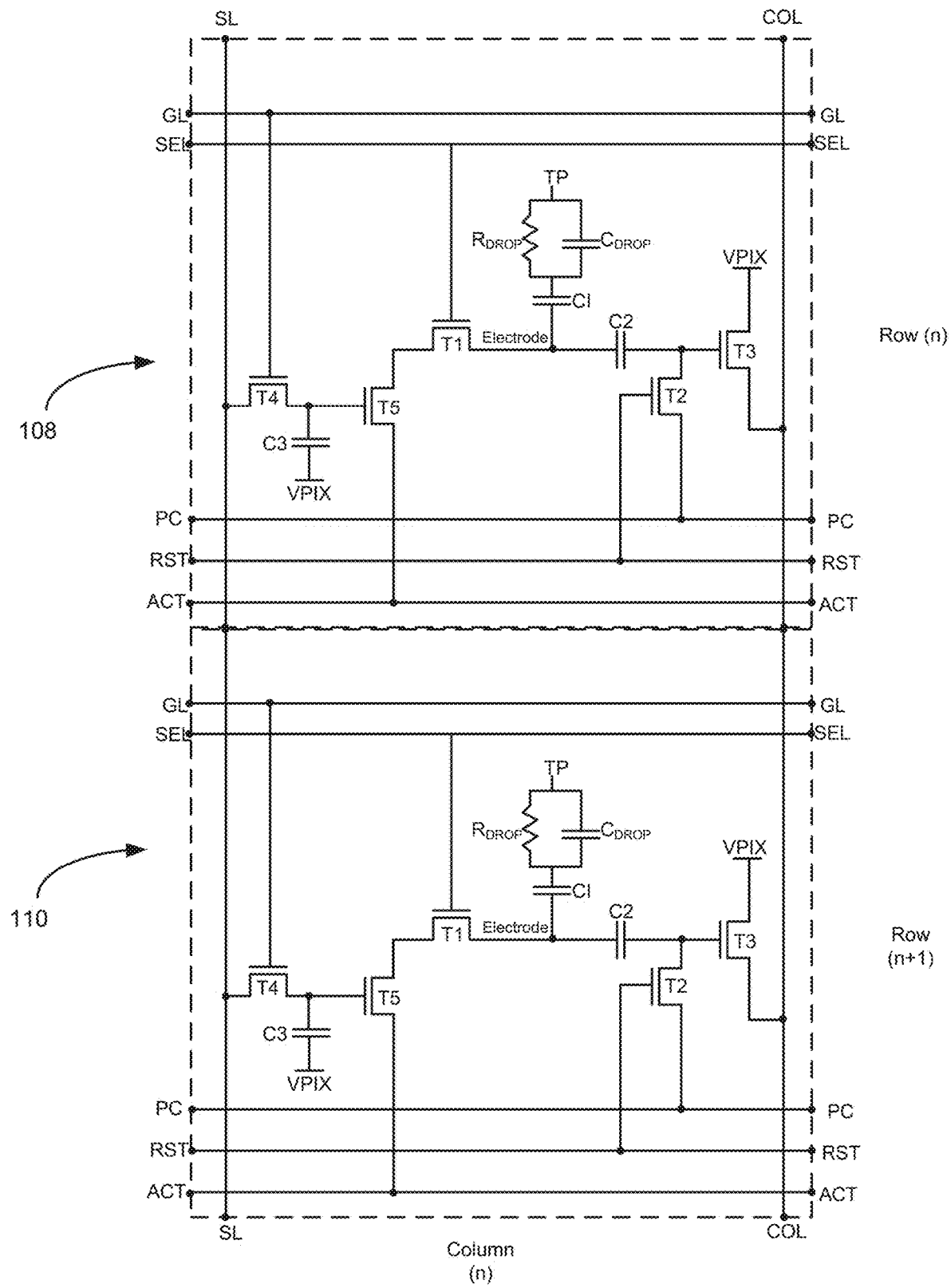
FIG. 13 is a drawing depicting a plurality of array elements including exemplary array element circuitry for an AM-EWOD device, which is a variation of FIG. 9 employing a different actuation circuit.
Figure 14:
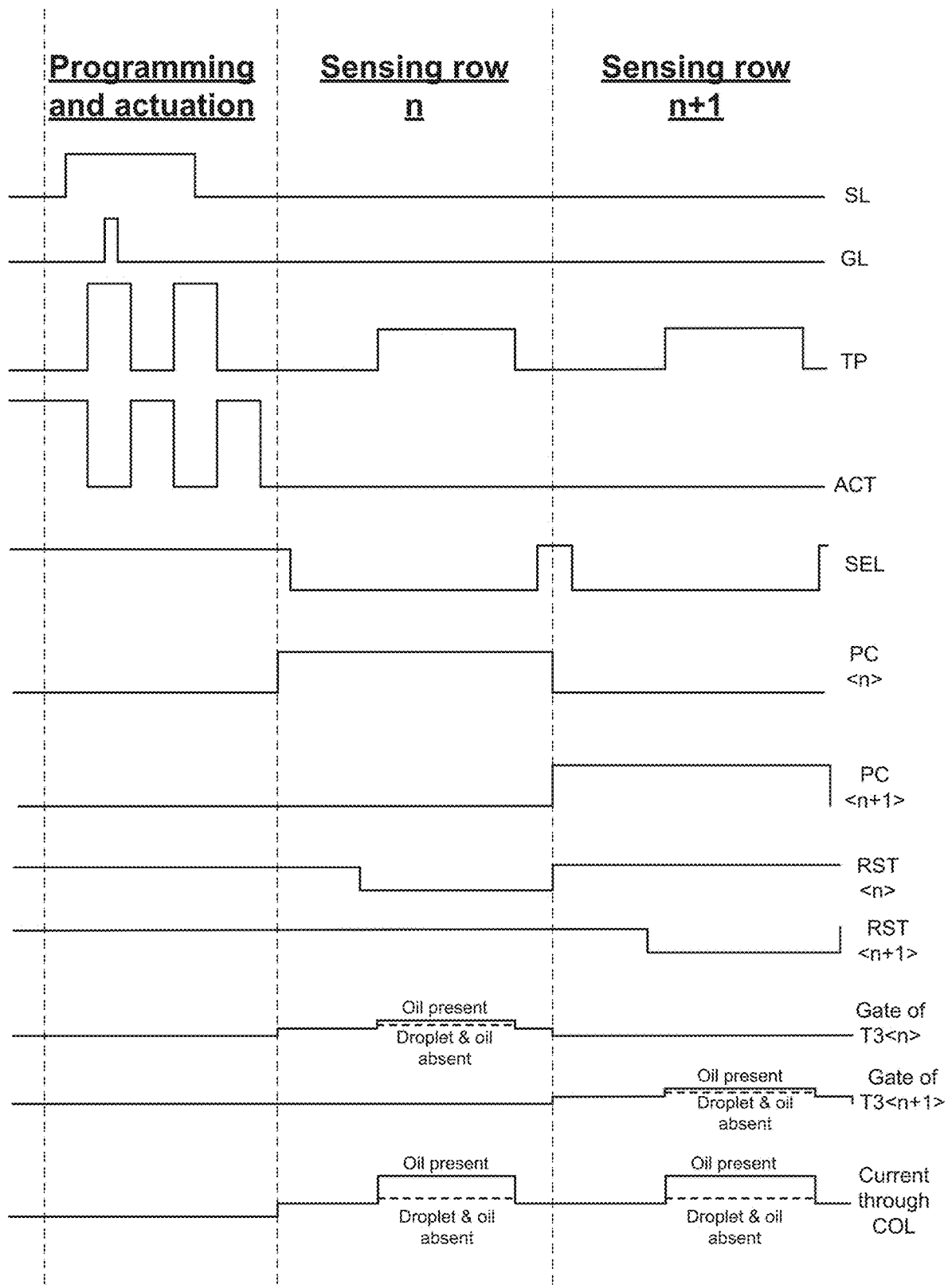
FIG. 14 is a timing diagram that illustrates the operation of the embodiment of FIG. 13.

The described modification of integrated impedance sensor circuitry, in which the sensor readout transistor is pre-charged by application of the pre-charging voltage PC in combination with applying the perturbation voltage, can be combined with any suitable actuation circuitry. For example, FIG. 13 is a drawing depicting a plurality of array elements 108 and 110 including exemplary array element circuitry for an AM-EWOD device, which provides an enhanced circuit configuration that improves over the configuration depicted in FIG. 7. FIG. 14 is a timing diagram that illustrates the operation of the embodiment of FIG. 13. FIG. 13, therefore, also depicts a pair of array elements including a first array element 108 and a second array element 110 in a Column(n) positioned in adjacent rows, respectively Row(n) and Row(n+1). Generally, the embodiment of FIG. 13 is a modification of the circuit configuration of FIG. 7, with the sensor readout transistor T3 being pre-charged by application of the pre-charging voltage PC through the reset transistor T2.

Because the impedance sensor circuitry with the pre-charged sensor readout transistor is comparable to that of FIGS. 9 and 11, the sensing operation is largely the same, with operational differences mainly being in the programming and actuation phase due to the different configuration of the actuation circuitry. The actuation and programming of such circuit configuration is described in Applicant's commonly assigned US 2017/0076676 referenced above including a 5-transistor 2-capacitor configuration, and is illustrated in the timing diagram of FIG. 14. To program a given array element 108 or 110 by writing voltage data to said array element, a voltage is loaded onto addressing line SL, and a pulse is applied to the gate line GL appropriate for the row being programmed, which in this example is either Row(n) or Row(n+1). This turns on T4 in the selected row, and the circuit node connected to the electrode is charged to the voltage pulse on the SL line. When GL is taken low, this voltage is preserved, stored on the additional capacitor C3.

With this arrangement, the stored voltage on C3 determines whether transistor T5 is on, and an additional select line SEL operates to turn on drive transistor T1 for actuation. With T5 and T1 both on, the electrode element is connected to the desired actuation voltage ACT. As shown in the timing diagram, this arrangement is particularly suitable for an AC actuation voltage as the SL voltage is merely a switching pulse, and an additional AC actuation voltage can be applied along the separate line ACT.

For sensing a given row, the select line SEL is taken low for that row to turn off T1. This isolates the respective array element from the actuation voltage during the sensing period. Sensing then proceeds otherwise as in the previous embodiment. To perform sensing on Row(n), in a reset step the reset transistor T2 of said row is turned on by the reset signal RST(n). The pre-charging row addressing line PC(n) is applied to bring the gate of the sensor readout transistor to a voltage sufficient to turn on the sensor readout transistor T3, so the gate of sensor readout transistor T3 charges to PC(n). The reset signal RST(n) is then taken low to disconnect PC(n) from the gate of T3. The voltage is stored on capacitor C2, keeping T3 in an on-state. Following the pre-charging, the reference electrode potential for array element 108—TP—is perturbed to a higher voltage, which is coupled through the sensor capacitor C2 of Row(n) to the gate of the sensor readout transistor T3. The resultant current from array element 108 passes through T3 and is sunk down the output line COL, which may then be sensed by column detection circuitry at the bottom of the column (not shown). As in previous examples, each row again is sensed independently of other rows. Accordingly, while Row(n) is being sensed, the array element corresponding to Row(n+1) is held in a non-sensing state. The reset transistor T2 on Row(n+1) remains turned on and applies the PC(n+1) signal to the gate of sensor readout transistor T3. However, the pre-charging row addressing line PC(n+1) is kept low so as to make sure that T3 of Row(n+1) is turned off at all times while Row(n) is being sensed and any current through the COL line is the result of the pixel on Row(n) only.

The sensing operation is then repeated for Row(n+1) to generate the output current from array element 110 to the output line COL. As seen in the timing diagram of FIG. 14, the level of the voltage at the gate of the sensor output transistor T3, and thus the resultant current sunk down the output line COL, is dependent upon whether a droplet or oil is present or absent in a given array element. The pre-charging effect applied to the gate of T3 also operates to increase the potential difference between the gate and source of the sensor readout transistor prior to applying the perturbation voltage, thereby increasing the effect of a voltage perturbation at the gate on the resultant output current from the sensor readout transistor.

Figure 8:
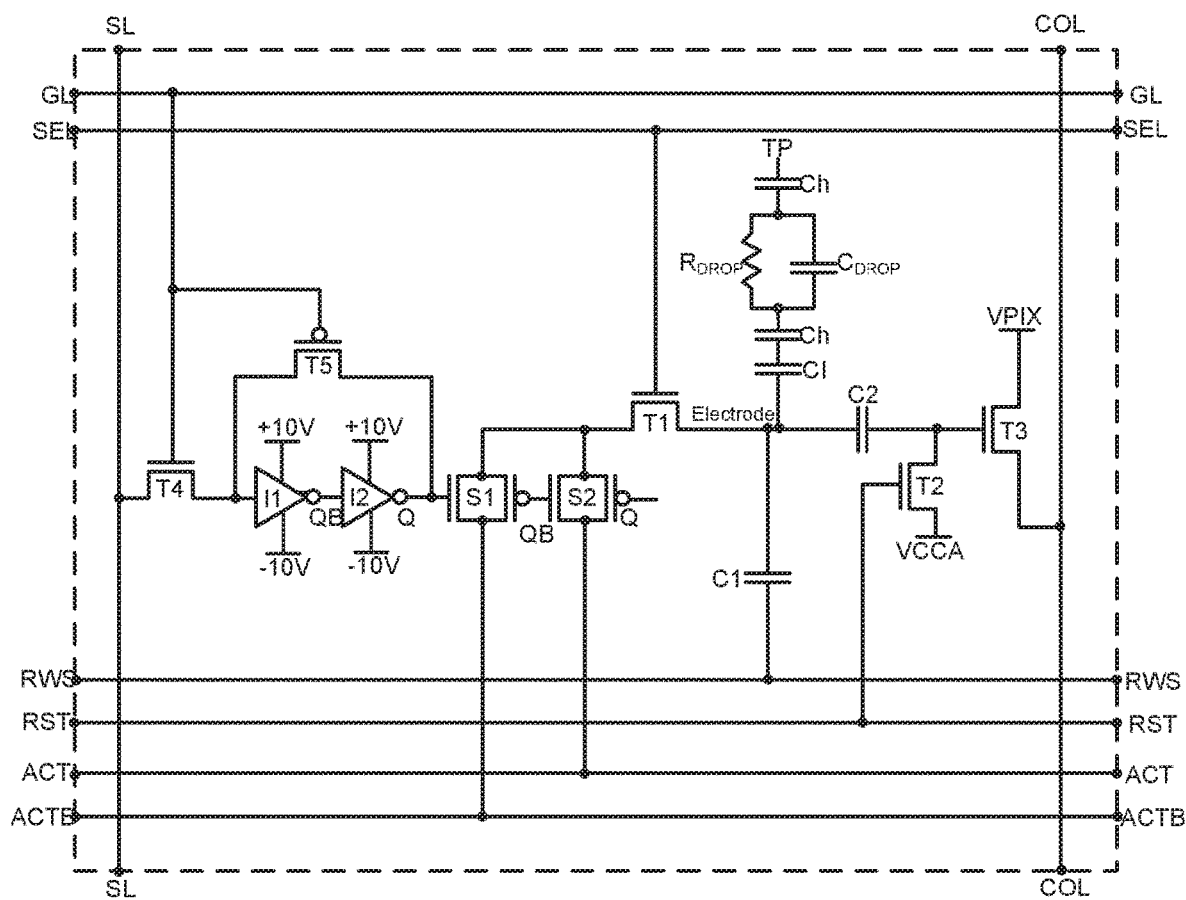
FIG. 8 is a drawing depicting an array element including exemplary array element circuitry for an AM-EWOD device that embodies another previous design of Applicant.
Figure 15:
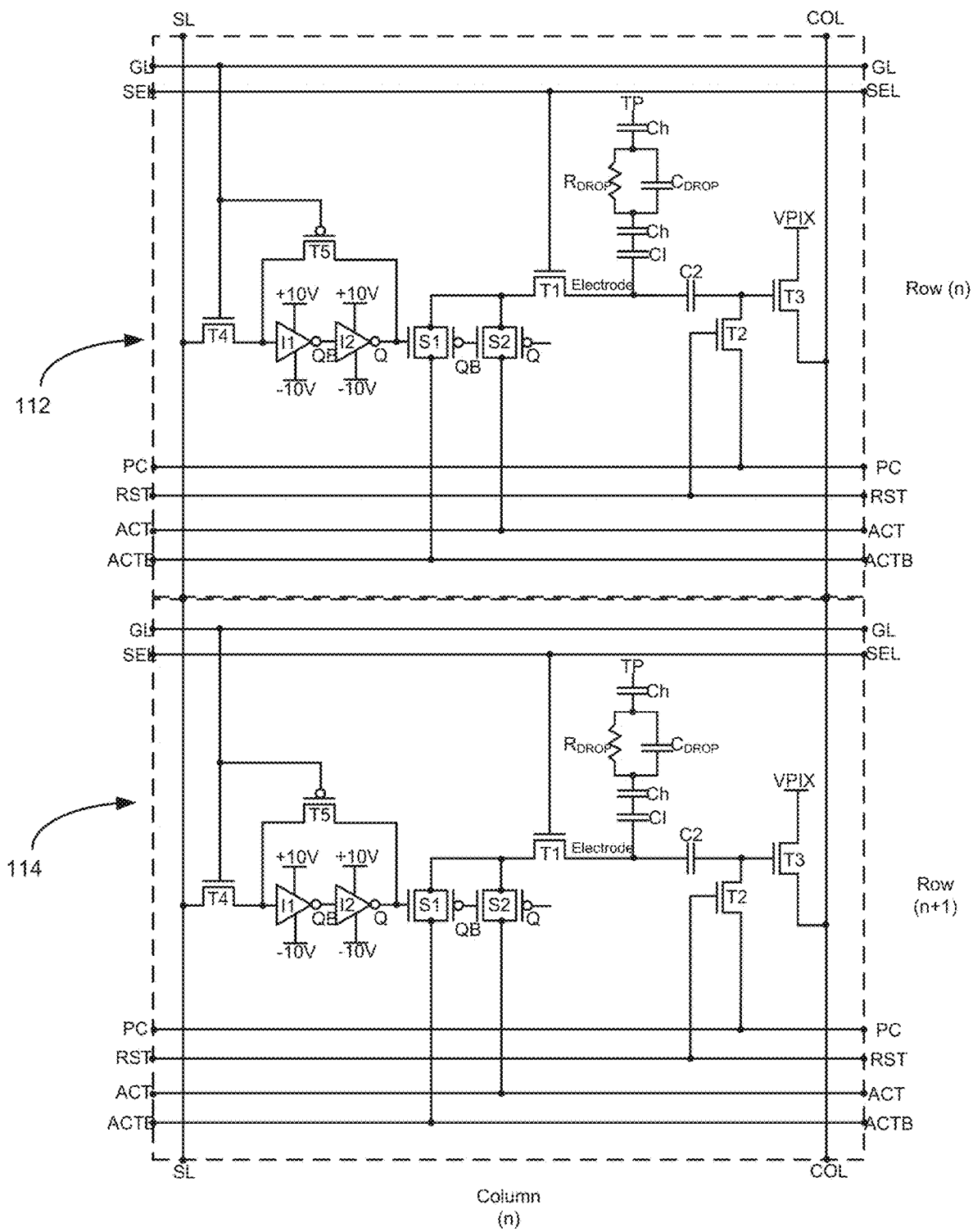
FIG. 15 is a drawing depicting a plurality of array elements including exemplary array element circuitry for an AM-EWOD device, which is a variation of FIG. 9 employing yet another different actuation circuit.
Figure 16:
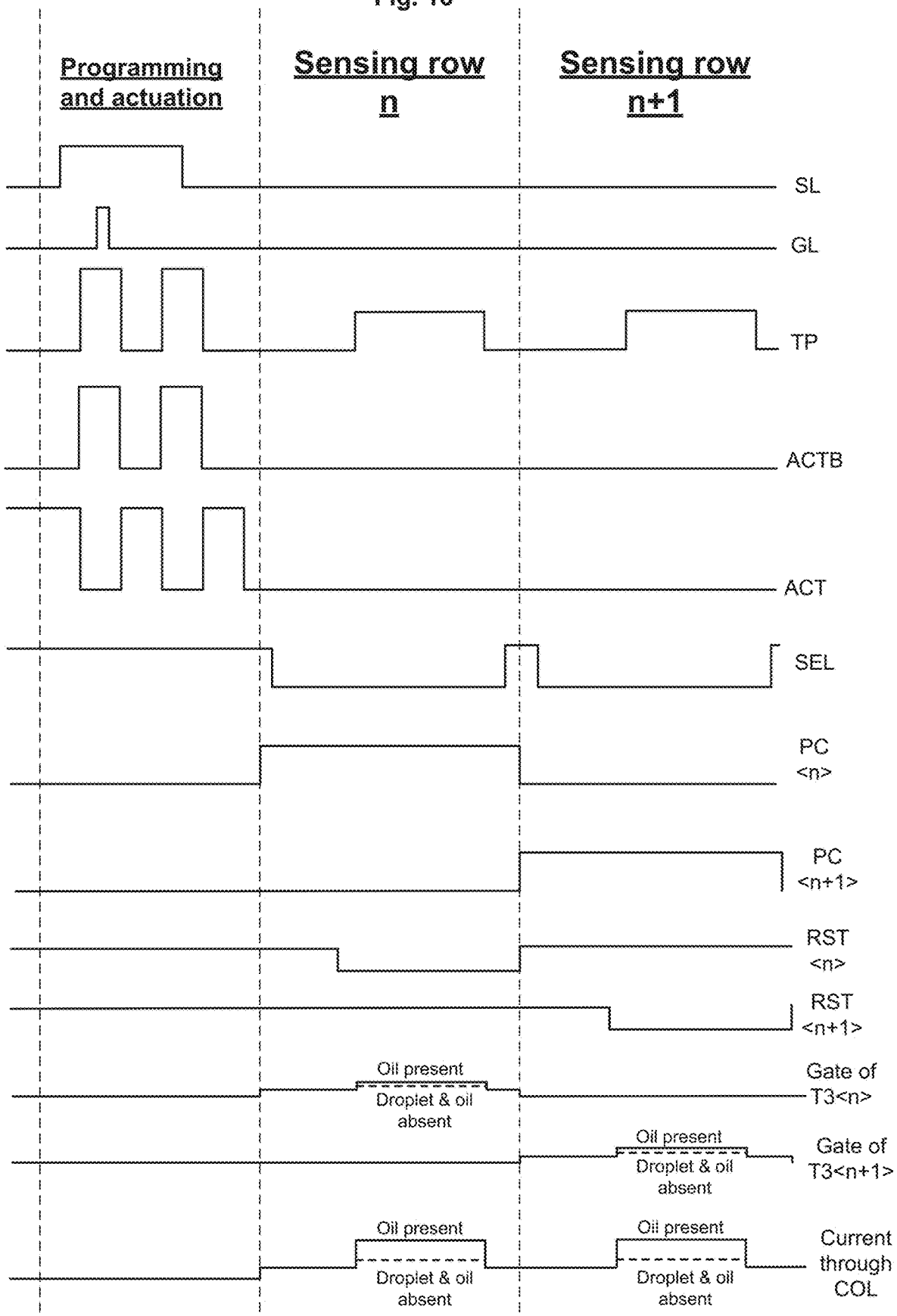
FIG. 16 is a timing diagram that illustrates the operation of the embodiment of FIG. 15.

As another example of combining impedance sensor circuitry having a pre-charged sensor readout transistor with different actuation circuitry, FIG. 15 is a drawing depicting a plurality of array elements including exemplary array element circuitry for an AM-EWOD device, which provides an enhanced circuit configuration that improves over the configuration depicted in FIG. 8. FIG. 16 is a timing diagram that illustrates the operation of the embodiment of FIG. 15. FIG. 15, therefore, also depicts a pair of array elements in a Column(n) including a first array element 112 and a second array element 114 positioned in adjacent rows, respectively Row(n) and Row(n+1). Generally, the embodiment of FIG. 15 is a modification of the circuit configuration of FIG. 8, with the sensor readout transistor T3 being pre-charged by application of the pre-charging voltage PC through the reset transistor T2.

Because the impedance sensor circuitry of FIG. 15 is comparable to that of FIGS. 9, 11, and 13, the sensing operation is largely the same, with operational differences mainly being in the programming and actuation phase due to the different configuration of the actuation circuitry. The actuation and programming of such circuit configuration is described in Applicant's commonly assigned U.S. Pat. No. 8,173,000 referenced above and described in connection with FIG. 8, and is illustrated in the timing diagram of FIG. 16. To program a given array element 112 or 114 by writing voltage data to said array element, a voltage pulse is supplied onto addressing line SL, and a pulse is applied to the gate line GL appropriate for the row being programmed, which in this example is either Row(n) or Row(n+1). This turns on T4 in the selected row, and the circuit node connected to the electrode is charged to the SL pulse voltage. The line GL also is connected to the p-type transistor T5 to control flow of current through or across the inverters I1 and I2, and in combination with the analogue switches S1 and S2 operate to apply either actuation voltage ACT or ACTB to the transistor T1. A select line SEL operates to turn on T1 for actuation by either ACT or ACTB as outputted by the actuation circuitry. With this configuration, a more various set of actuation voltages can be supplied, which may be more suitable for certain applications.

Similarly as in the previous embodiments, for sensing a given row the select line SEL is taken low for that row to turn off T1. This isolates the respective array element from the actuation voltage during the sensing period. Sensing then proceeds otherwise as in the previous embodiments. To perform sensing on Row(n), in a reset step the reset transistor T2 of said row is turned on by the reset signal RST(n). The pre-charging row addressing line PC(n) is applied to the gate of the sensor readout transistor to a voltage sufficient to turn on the sensor readout transistor T3, so the gate of sensor readout transistor T3 charges to PC(n). The reset signal RST(n) is then taken low to disconnect PC(n) from the gate of T3. The voltage is stored on capacitor C2, keeping T3 in an on-state. Following the pre-charging, the reference electrode potential for array element 112—TP—is perturbed to a higher voltage, which is coupled through the sensor capacitor C2 of Row(n) to the gate of the sensor readout transistor T3. The resultant current from array element 112 passes through T3 and is sunk down the output line COL, which may then be sensed by column detection circuitry at the bottom of the column (not shown). As in previous examples, each row again is sensed independently of other rows. Accordingly, while Row(n) is being sensed, the array element corresponding to Row(n+1) is held in a non-sensing state. The reset transistor T2 on Row(n+1) remains turned on and applies the PC(n+1) signal to the gate of sensor readout transistor T3. However, the pre-charging row addressing line PC(n+1) is kept low so as to make sure that T3 of Row(n+1) is turned off at all times while Row(n) is being sensed and any current through the COL line is the result of the pixel on Row(n) only.

The sensing operation is then repeated for Row(n+1) to generate the output current from array element 114 to the output line COL. As seen in the timing diagram of FIG. 16, the level of the voltage at the gate of the sensor output transistor T3, and thus the resultant current sunk down the output line COL, is dependent upon whether a droplet or oil is present or absent in a given array element. The pre-charging effect applied to the gate of T3 also operates to increase the potential difference between the gate and source of the sensor readout transistor in combination with applying the perturbation voltage, thereby increasing the effect of a voltage perturbation at the gate on the resultant output current from the sensor readout transistor.

Figure 17:
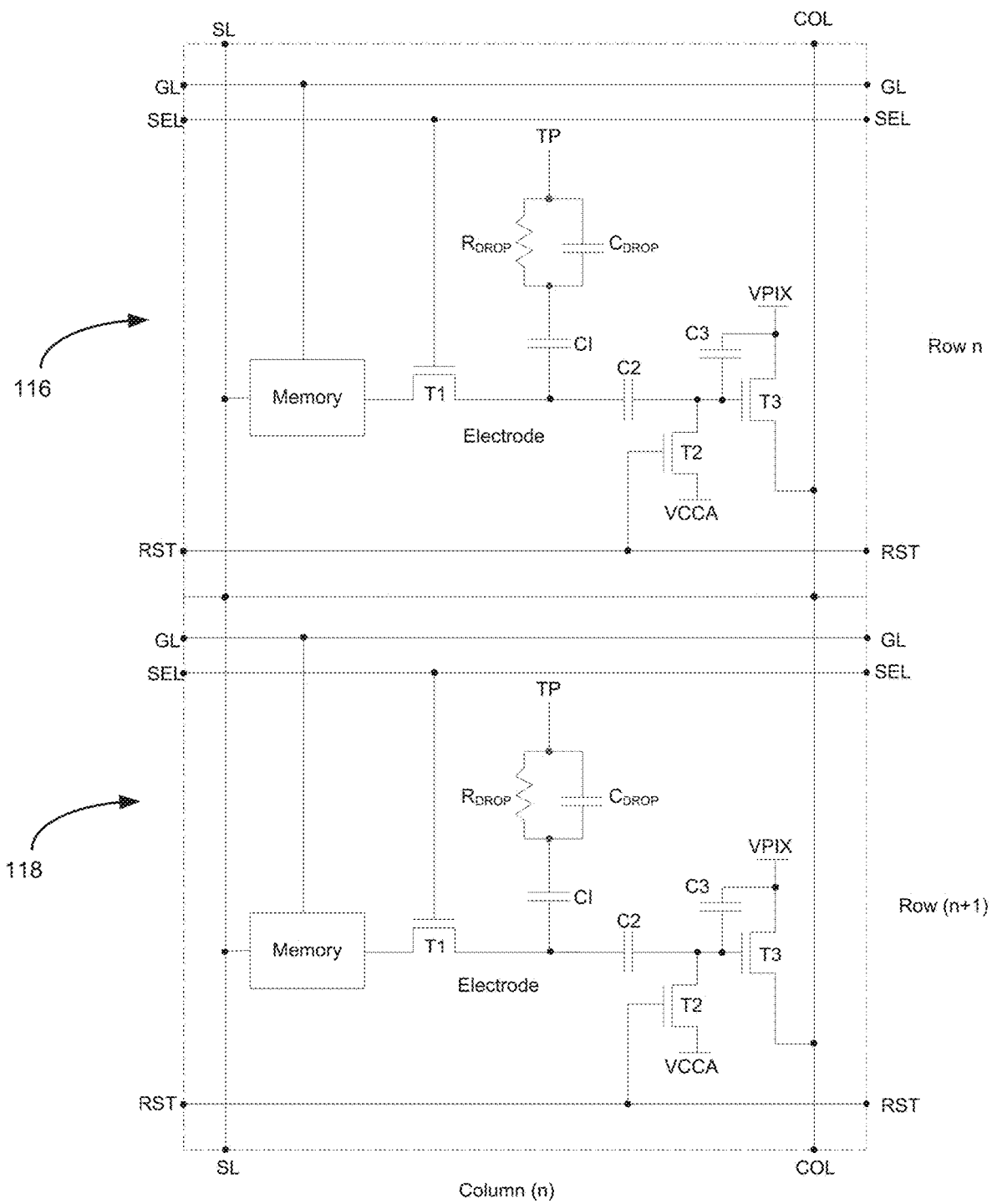
FIG. 17 is a drawing depicting a plurality of array elements including exemplary array element circuitry for an AM-EWOD device, which employs a boost capacitor to pre-charge a sensor readout transistor.
Figure 18:
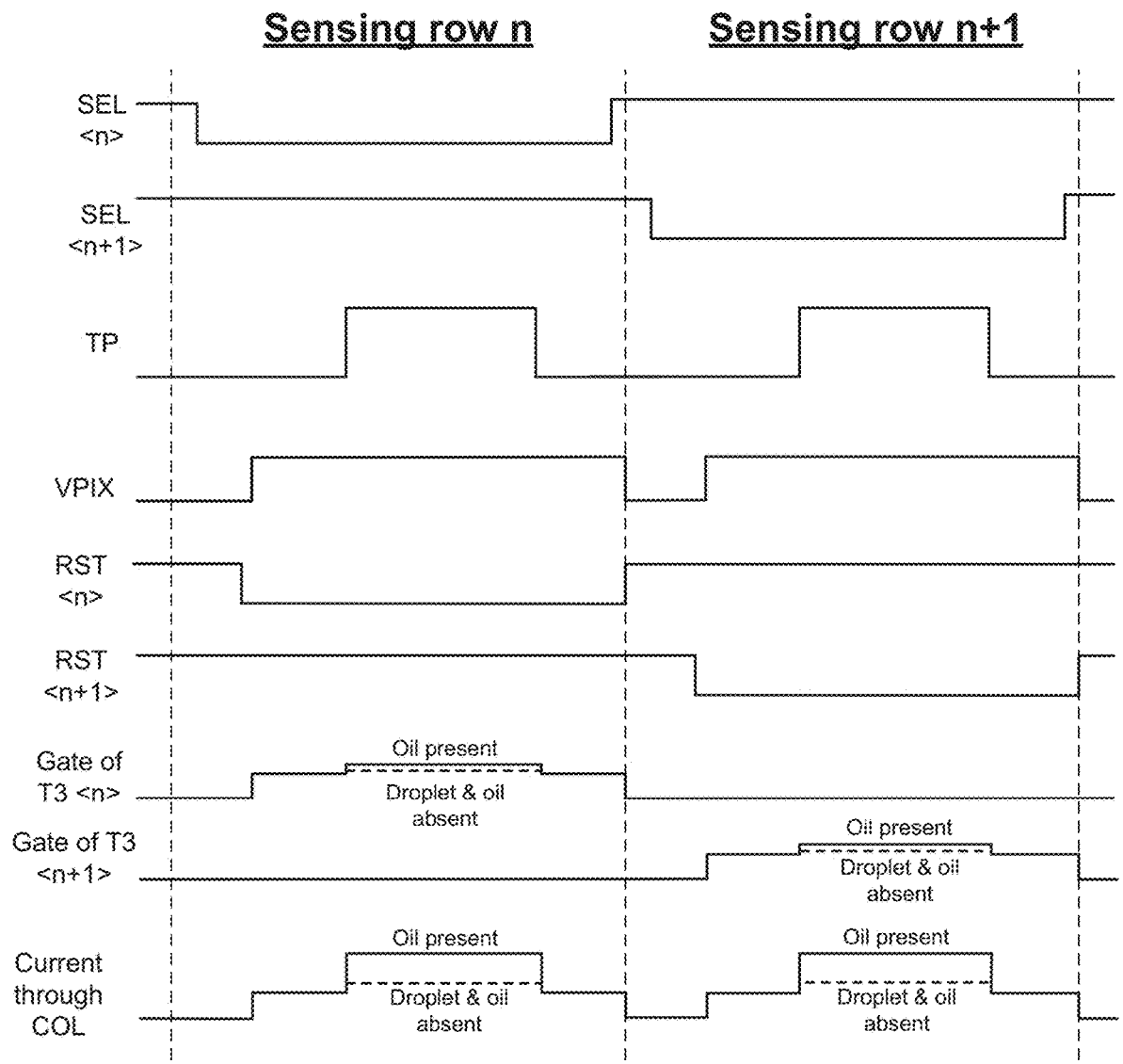
FIG. 18 is a timing diagram that illustrates the operation of the embodiment of FIG. 17.

In the previous embodiments, the pre-charging voltage applied to the gate of the sensor readout transistor T3 was accomplished by applying said pre-charging voltage through the reset transistor T2. In subsequent embodiments described below, alternative methods of applying a pre-charging effect to turn on the sensor readout transistor in combination with applying the perturbation voltage are illustrated. As one such example, FIG. 17 is a drawing depicting a plurality of array elements including exemplary array element circuitry for an AM-EWOD device, in which a boost capacitor is incorporated in the array element circuitry for pre-charging the sensor readout transistor. FIG. 18 is a timing diagram that illustrates the operation of the embodiment of FIG. 17. FIG. 17 depicts a pair of array elements in a Column(n) including a first array element 116 and a second array element 118 positioned in adjacent rows, respectively Row(n) and Row(n+1). Generally, the embodiment of FIG. 17 is a modification of the circuit configuration of FIGS. 6 and 7, but with an additional boost capacitor C3 connected between two of the three terminals of the sensor readout transistor T3, the gate and the drain (which is also connected to the pixel voltage supply VPIX). The final transistor terminal, the source, is connected to the COL output.

Referring to the circuit configuration of FIG. 17 in combination with the timing diagram of FIG. 18, programming and actuation occurs comparably as in the previous design of FIG. 6. To simplify the illustration, the actuation circuit in FIG. 17 is represented by the memory block. To program a given array element 116 or 118 by writing voltage data to said array element, the actuation voltage to be programmed is loaded onto an addressing line SL, and a pulse is applied to the gate line GL appropriate for the row being programmed, which in this example is either Row(n) or Row (n+1). For actuation, a select signal SEL is applied to turn on T1 in the selected row, and the circuit node connected to the electrode is charged to the programmed voltage.

To perform sensing of a given row, say Row(n) in this example, the SEL(n) line is taken low to isolate the actuation circuit by turning off T1 for Row(n). In a reset step the reset transistor T2 of said row is turned on by a reset signal RST(n), and VCCA is applied to the gate of T3 to cancel effects of a previous frame. For the sensing row, the capacitor C2 at the gate of transistor T3 is charged to the VCCA potential and RST(n) is taken low to leave this node undriven. The pre-charging is then performed by shifting VPIX to a higher voltage after the reset operation, which is coupled through a boost capacitor C3 that is connected between VPIX (also the drain of T3) and the gate of T3. For appropriate pre-charging of T3, the VPIX voltage shift is selected specifically to be a voltage sufficient to turn on the sensor readout transistor T3, so the gate of sensor readout transistor T3 changes by the same voltage shift as VPIX. As the capacitor C2 also is connected to the gate of T3, the gate voltage of T3 also is applied to the capacitor C2. VPIX is then kept at the new, shifted voltage to keep the gate of T3 at the new, higher voltage and to keep T3 turned on. Following the pre-charging, the reference (top) electrode potential for array element 116—TP—is perturbed to a higher voltage. The perturbation is coupled through the sensor capacitor C2 of Row(n) to the gate of the sensor readout transistor T3, and the change in the voltage at the gate of transistor T3 alters the current flow through T3 as generated from the pixel voltage supply VPIX. The resultant current from array element 116 passes through T3 and is sunk down the output line COL, which may then be sensed by column detection circuitry at the bottom of the column (not shown). As in the previous embodiments, the pre-charging effect applied to the gate of T3, this time through the boost capacitor C3, operates to increase the potential difference between the gate and source of the sensor readout transistor, thereby increasing the effect of a voltage perturbation at the gate on the resultant output current from the sensor readout transistor.

In this example, each row is sensed independently of other rows. Accordingly, as shown in the timing diagram of FIG. 18, while Row(n) is being sensed, the select line for Row (n+1), SEL(n+1), remains high so that the actuation circuit remains electrically connected to the element (bottom) electrode of the array element. Additionally, the RST(n+1) signal remains high throughout so that the gate of transistor T3 on Row(n+1) is held at the VCCA potential throughout the sensing period of Row(n). This prevents anything coupling through to the output line COL from any other pixels connected to it other than on row(n).

The sensing operation is then repeated for Row(n+1), which is performed by pre-charging the sensor readout transistor for Row(n+1) via the boost capacitor C3 of that row. Accordingly, the SEL(n+1) line is taken low to isolate the actuation circuit by turning off T1 for Row(n+1). In a reset step the reset transistor T2 of said row is turned on by a reset signal RST(n+1), and the reset voltage VCCA is applied to reset the voltage at the gate of T3. For the sensing row, the capacitor C2 at the gate of transistor T3 is charged to the VCCA potential and RST(n+1) is taken low to leave this node undriven. The VPIX voltage shift is then applied to the gate of the sensor readout transistor T3 to pre-charge the gate of T3 through the boost capacitor C3 of that row. In particular, the VPIX voltage shift that is coupled through the boost capacitor C3 is shifted specifically by a voltage sufficient to turn on the sensor readout transistor T3, so the gate of sensor readout transistor T3 is shifted up by the same amount as VPIX is. Again, a current will flow through T3 due to application of the pixel voltage supply VPIX voltage shift, with the current being dependent upon the voltage at the gate of T3. As the capacitor C2 also is connected to the gate of T3, the gate voltage of T3 also is applied to the capacitor C2. Following the pre-charging, the reference electrode potential for array element 118—TP—is perturbed to a higher voltage. The perturbation is coupled through the sensor capacitor C2 of Row(n+1) to the gate of the sensor readout transistor T3, and the change in the voltage at the gate of transistor T3 alters the current flow through T3 as generated from the pixel voltage supply VPIX voltage shift. The resultant current from array element 118 passes through T3 and is sunk down the output line COL, which may then be sensed by column detection circuitry at the bottom of the column (not shown). Again, the pre-charging effect applied to the gate of T3 through the boost capacitor C3 operates to increase the potential difference between the gate and source of the sensor readout transistor, thereby increasing the effect of a voltage perturbation at the gate on the resultant output current from the sensor readout transistor. For effective sensing, while Row(n+1) is being sensed, now the select line for Row(n), SEL(n), remains high so that the actuation circuit remains electrically connected to the element (bottom) electrode of the array element 116. Additionally, the RST(n) signal remains high throughout so that the gate of transistor T3 on Row(n) is held at the VCCA potential throughout the sensing period of Row(n+1). This prevents anything coupling through to the output line COL from any other pixels connected to it other than on Row(n+1).

As seen in the timing diagram of FIG. 18, the level of the voltage at the gate of the sensor readout transistor T3, and thus the resultant current sunk down the output line COL, is dependent upon whether a droplet or oil is present or absent. For each array element 116 and 118, therefore, the presence or absence of a droplet or oil is sensed. In addition, the degree of sensitivity is enhanced by the pre-charging operation applied to the gate of the sensor readout transistor T3 through the boost capacitor C3 prior to applying the perturbation voltage, which has the numerous advantages described above over conventional configurations.

Figure 19:
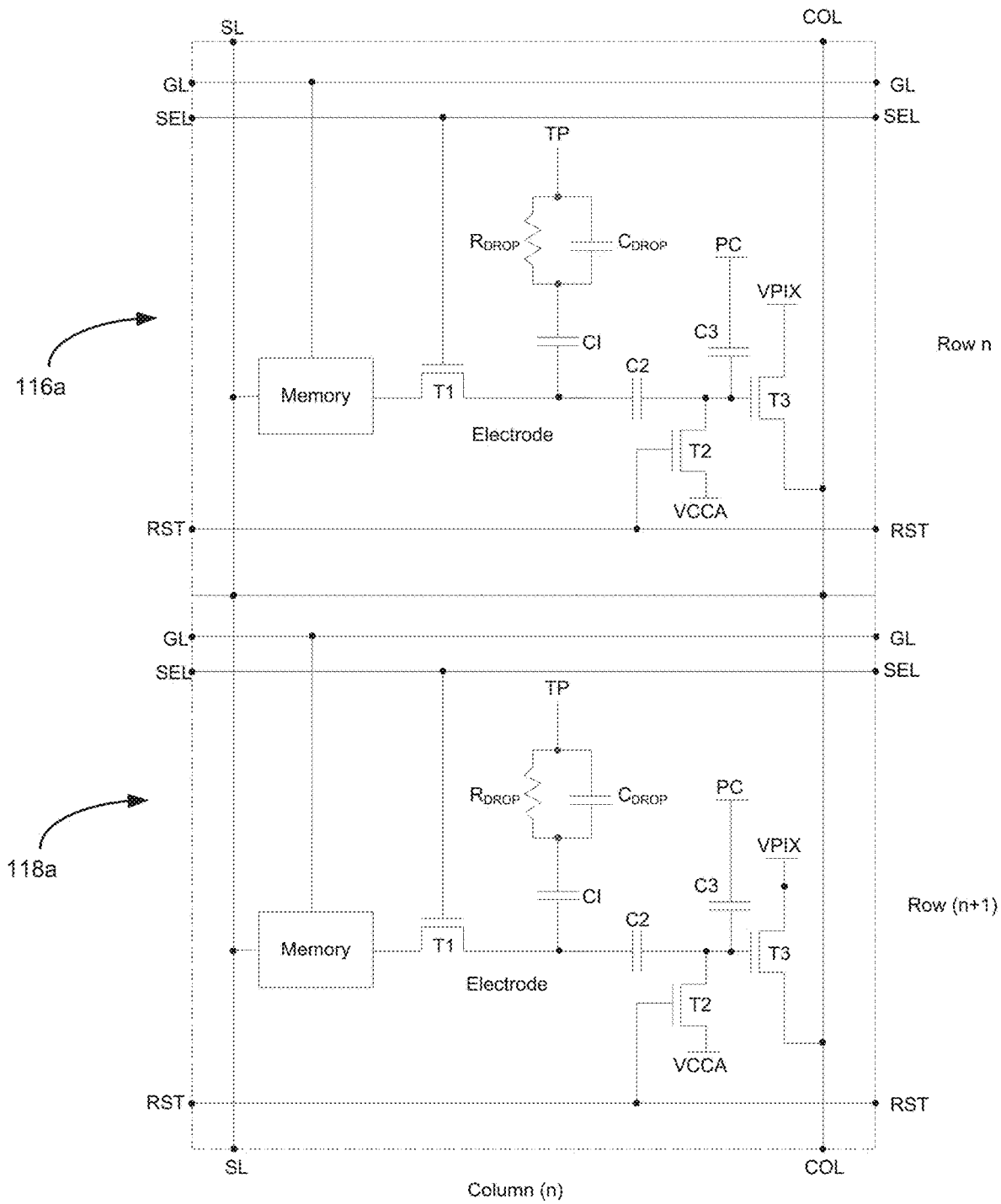
FIG. 19 is a drawing depicting a variation of the circuitry of FIG. 17, which also employs a boost capacitor that is incorporated in the array element circuitry for pre-charging the sensor readout transistor.
Figure 20:
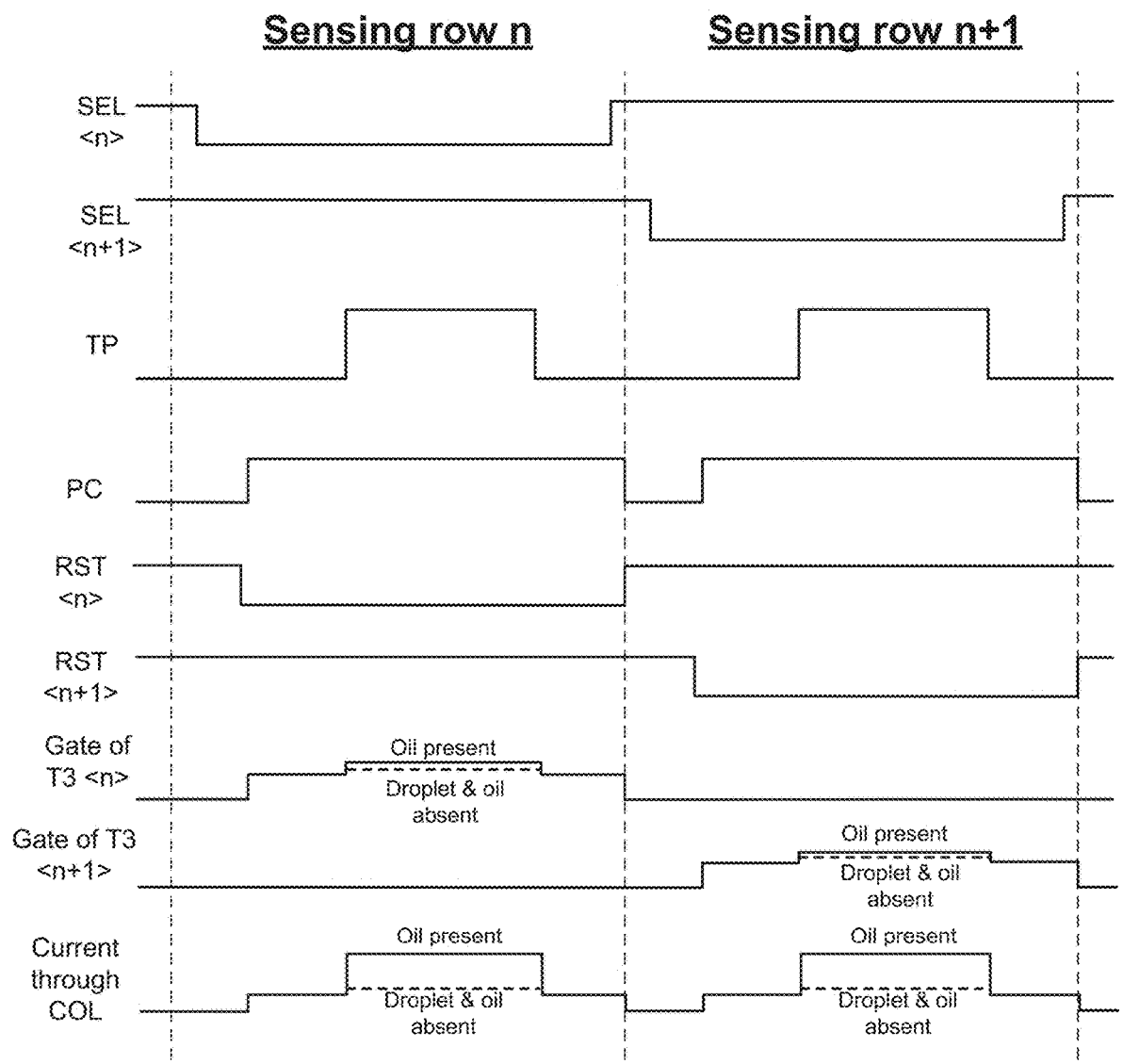
FIG. 20 is a timing diagram that illustrates the operation of the embodiment of FIG. 19.

FIG. 19 is a drawing depicting a variation of the circuitry of FIG. 17, which also employs a boost capacitor C3 in array elements 116a and 118a that is incorporated in the array element circuitry for pre-charging the sensor readout transistor T3. FIG. 20 is a timing diagram that illustrates the operation of the embodiment of FIG. 19. In this variation, the boost capacitor C3 is not connected to VPIX but is instead connected to a separate pre-charging voltage, PC. Instead of using the signal VPIX to pre-charge the gate of T3, this signal PC is shifted up after the reset operation, which is coupled through a boost capacitor C3 that is connected between PC and the gate of T3. This has the effect of turning T3 on a suitable amount so that small changes in the gate voltage, due to the perturbation voltage coupling through C2 to the gate of T3, result in larger changes in the resultant output current from the sensor readout transistor. In other pertinent respects, the configuration of FIG. 19 otherwise operates comparably as the circuit configuration of FIG. 17.

Figure 21:
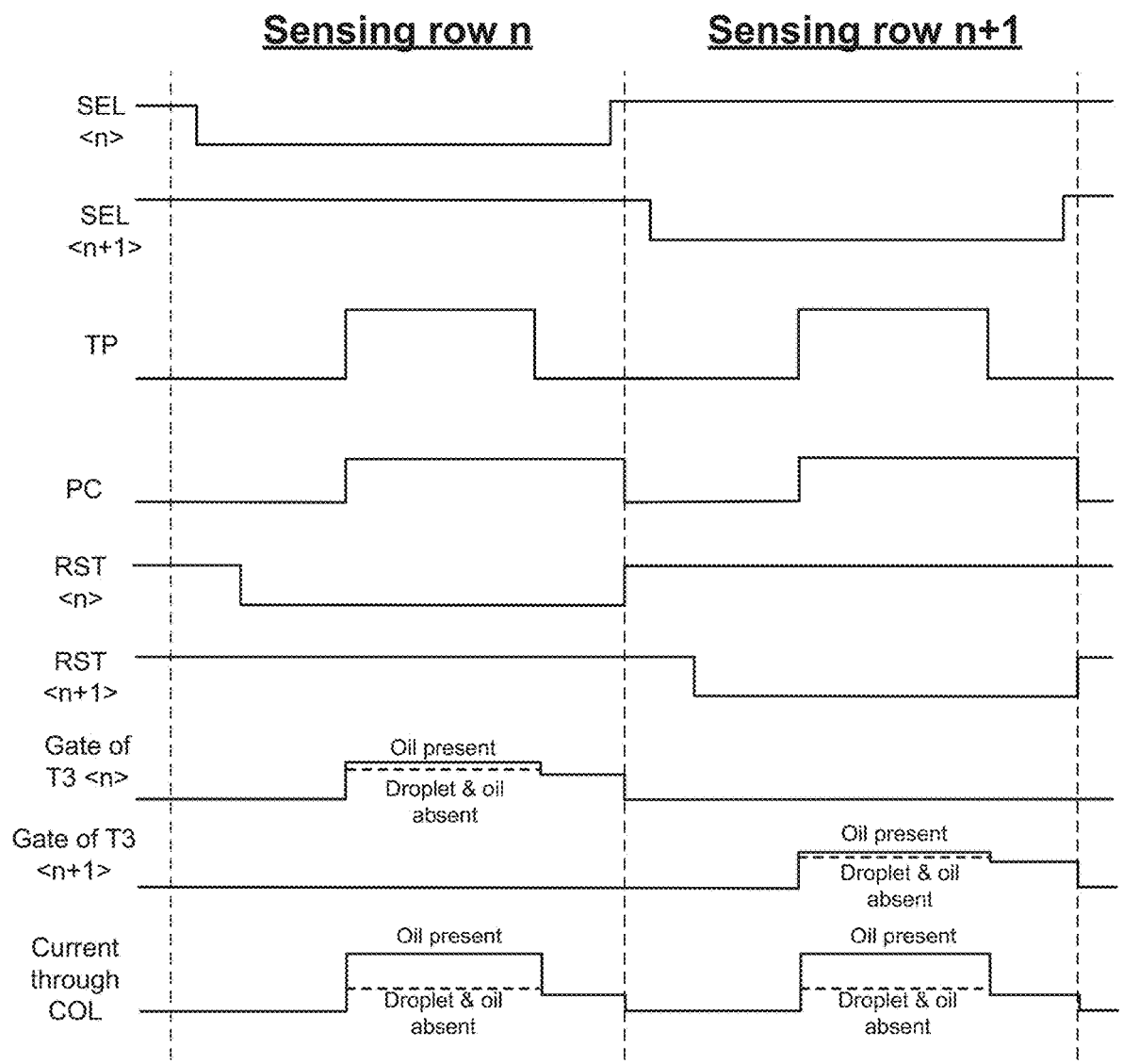
FIG. 21 is a timing diagram that illustrates the operation of the embodiment of FIG. 19 with an alternative timing of the pre-charging voltage.

The circuit in FIG. 19 can also be operated in different ways by which the pre-charging operation does not occur prior to the perturbation voltage. The pre-charging operation can also occur at the same time as the perturbation voltage. The pre-charging voltage could also begin after the perturbation voltage has begun. In both cases the effect of the voltage perturbation on the output current from the sensor readout transistor is increased. FIG. 21 is a timing diagram that illustrates the operation of the circuit in FIG. 19 when the pre-charging operation and the perturbation voltage occur at the same time. The voltage shift on the pre-charging signal, PC, is coupled through the boost capacitor C3 to the gate of T3, which turns on T3 a suitable amount so that any small changes in the gate voltage, due to the perturbation voltage coupling through C2 at the same time, results in a larger change in the resultant output current. The fact that these events occur at the same time does not alter how they affect the output current from T3.

Figure 22:
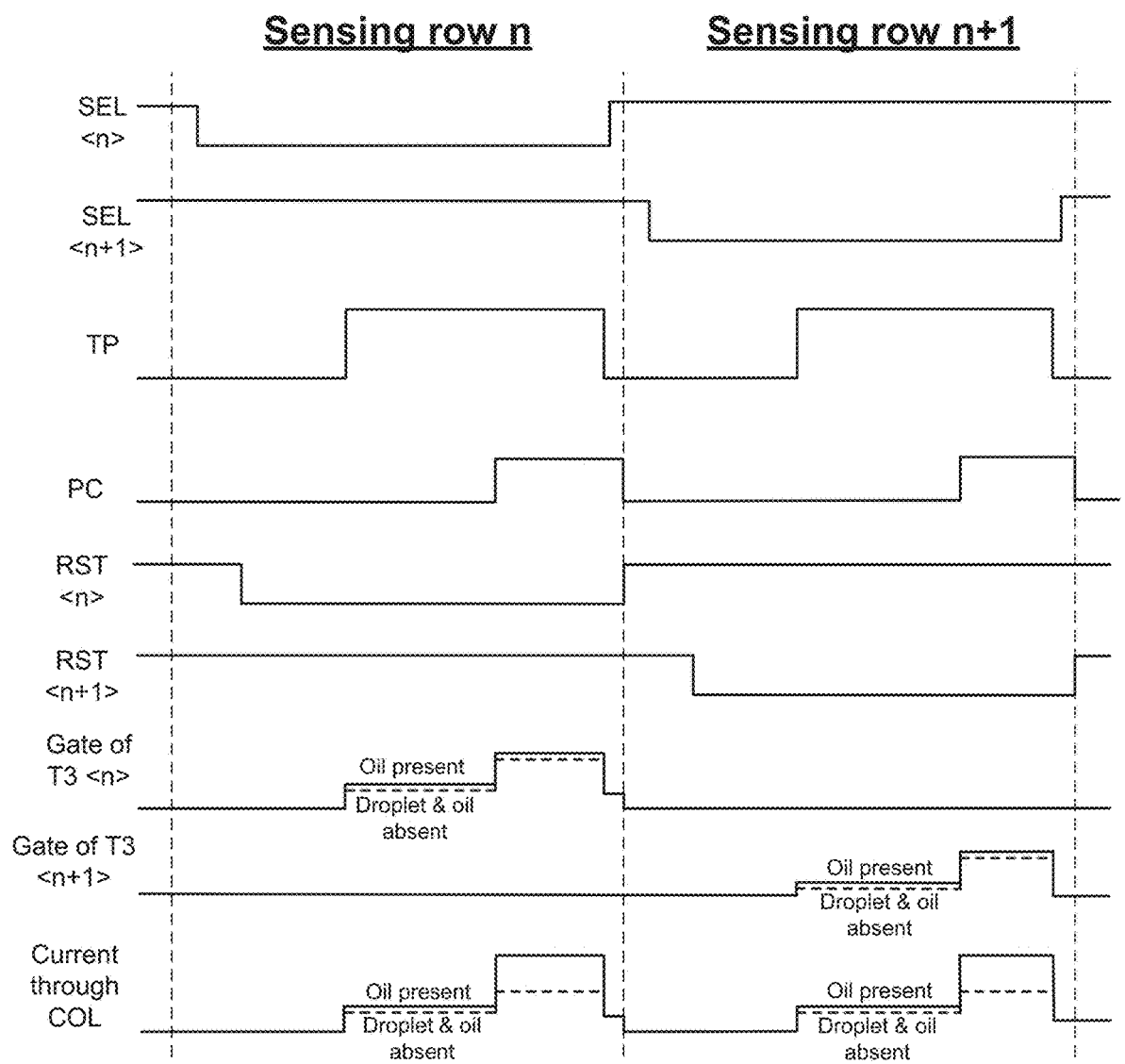
FIG. 22 is a timing diagram that illustrates the operation of the embodiment of FIG. 19 with another alternative timing of the pre-charging voltage.

FIG. 22 is a timing diagram that illustrates the operation of the circuit in FIG. 19 when the pre-charging operation occurs after the perturbation voltage begins. If a small voltage change due to the perturbation voltage is coupled through C2 to the gate of T3, an additional pre-charging step can take place afterwards that couples through the boost capacitor C3 to the gate of T3. This will turn on T3 by a suitable amount that the small change in the gate voltage, from the perturbation voltage, is seen in a larger change in the resultant output current onto the COL line. The fact that the pre-charging event occurs after the perturbation voltage begins does not alter how the output current from T3 is affected by the pre-charging operation.

Figure 23:
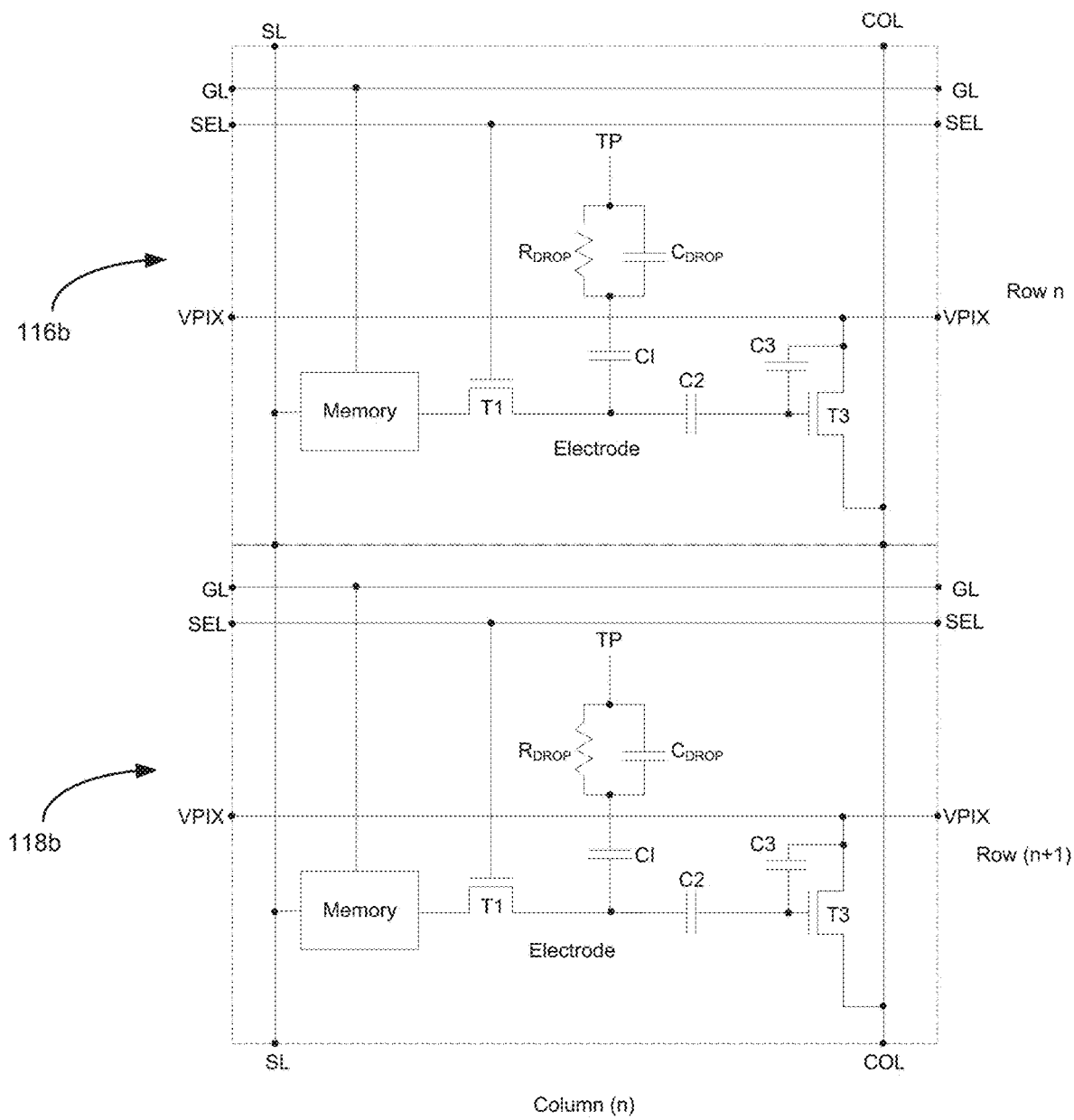
FIG. 23 is a drawing depicting a plurality of array elements including exemplary array element circuitry for an AM-EWOD device, which is a variation of FIGS. 17 and 19 that does not employ an additional reset transistor.
Figure 24:
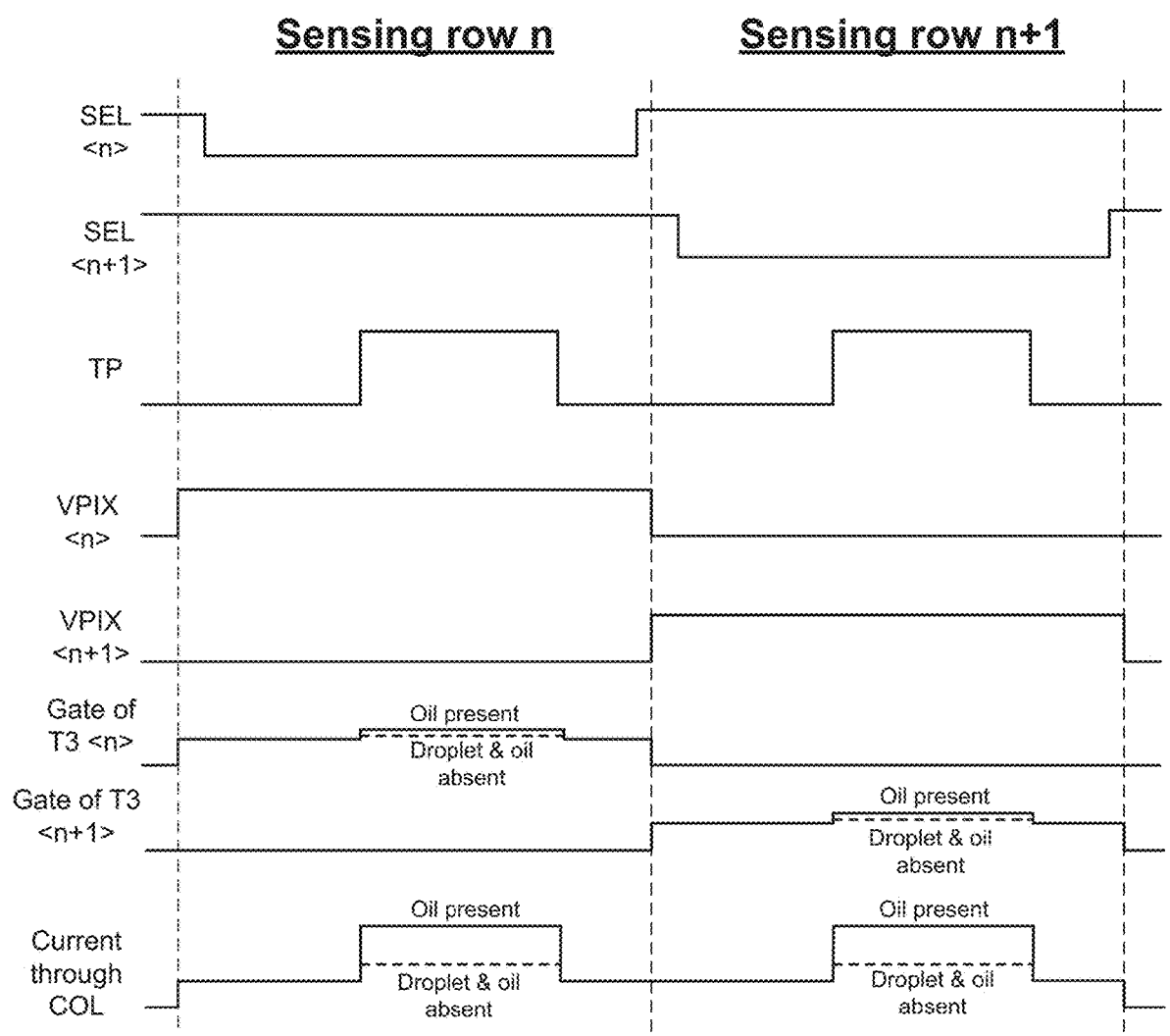
FIG. 24 is a timing diagram that illustrates the operation of the embodiment of FIG. 23.

FIG. 23 is a drawing depicting a variation of the circuitry of FIGS. 17 and 19, which also employs a boost capacitor C3 that is incorporated in the array element circuitry for pre-charging the sensor readout transistor T3. FIG. 24 is a timing diagram that illustrates the operation of the embodiment of FIG. 23. In this variation, the reset transistor T2 is omitted in array elements 116b and 118b. Essentially, as shown in the timing diagram, the VPIX voltage shift is applied at the beginning of the sensing phase, and thus operates to select the row that is to be sensed, a function previously fulfilled by the reset operation, and to apply the pre-charging voltage to the gate of the sensor readout transistor T3. In this variation, without the presence of the reset transistor, the pre-charging operation also is employed to select the appropriate row being sensed. Accordingly, the application of a VPIX pulse through capacitor C3 increases the voltage at the gate of T3 at the beginning of the sensing period for the given row only, increasing the voltage between the gate and the source for the array element circuitry on that row alone and causing a current to flow from VPIX to the COL line. Once this operation is performed, the TP pulse may be applied to perform the actual sensing operation, which will only generate a significant output from the T3 transistor on the selected row, where the sensor output transistors T3 have an increased gate-source voltage which turns on T3 and increases the effect of variations of gate voltage on the output current. For all other rows the gate-source voltages of the T3 transistors are not changed, and so should not be turned on and should not influence the current on the COL line. In pertinent respects, the configuration of FIG. 23 otherwise operates comparably as the circuit configuration of FIGS. 17 and 19.

In the above embodiment the gates of each of the sensor readout transistors are not driven so the state of T3 may not be known. The embodiment described with respect to FIG. 23 may not perform as efficiently compared to other embodiments described herein. The embodiment represented by the circuit configuration of FIG. 23, however, does represent a viable circuit configuration.

Figure 25:
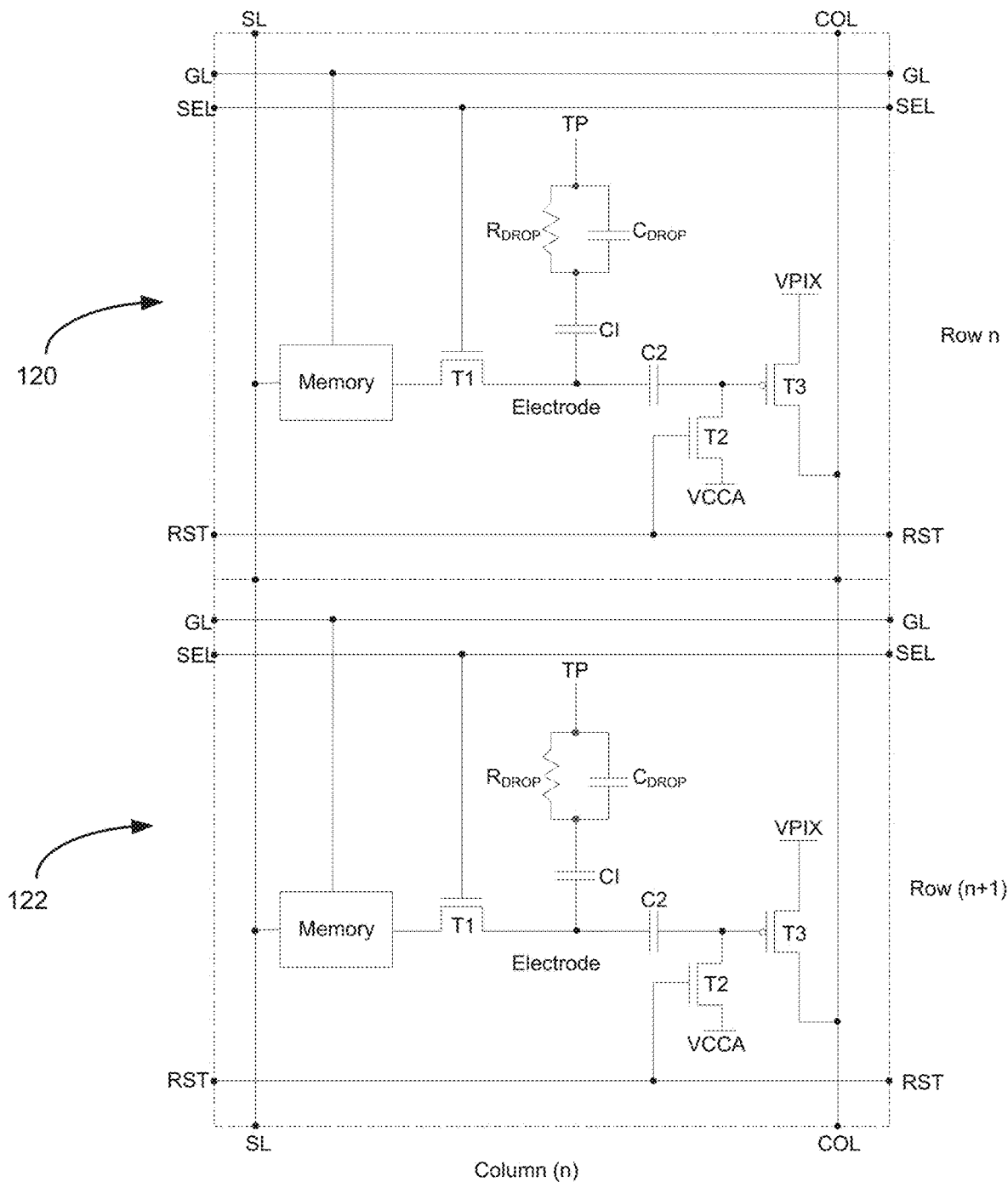
FIG. 25 is a drawing depicting a plurality of array elements including exemplary array element circuitry for an AM-EWOD device, which employs a p-type sensor readout transistor that is turned on during the sensing phase prior to perturbing the voltage.
Figure 26:
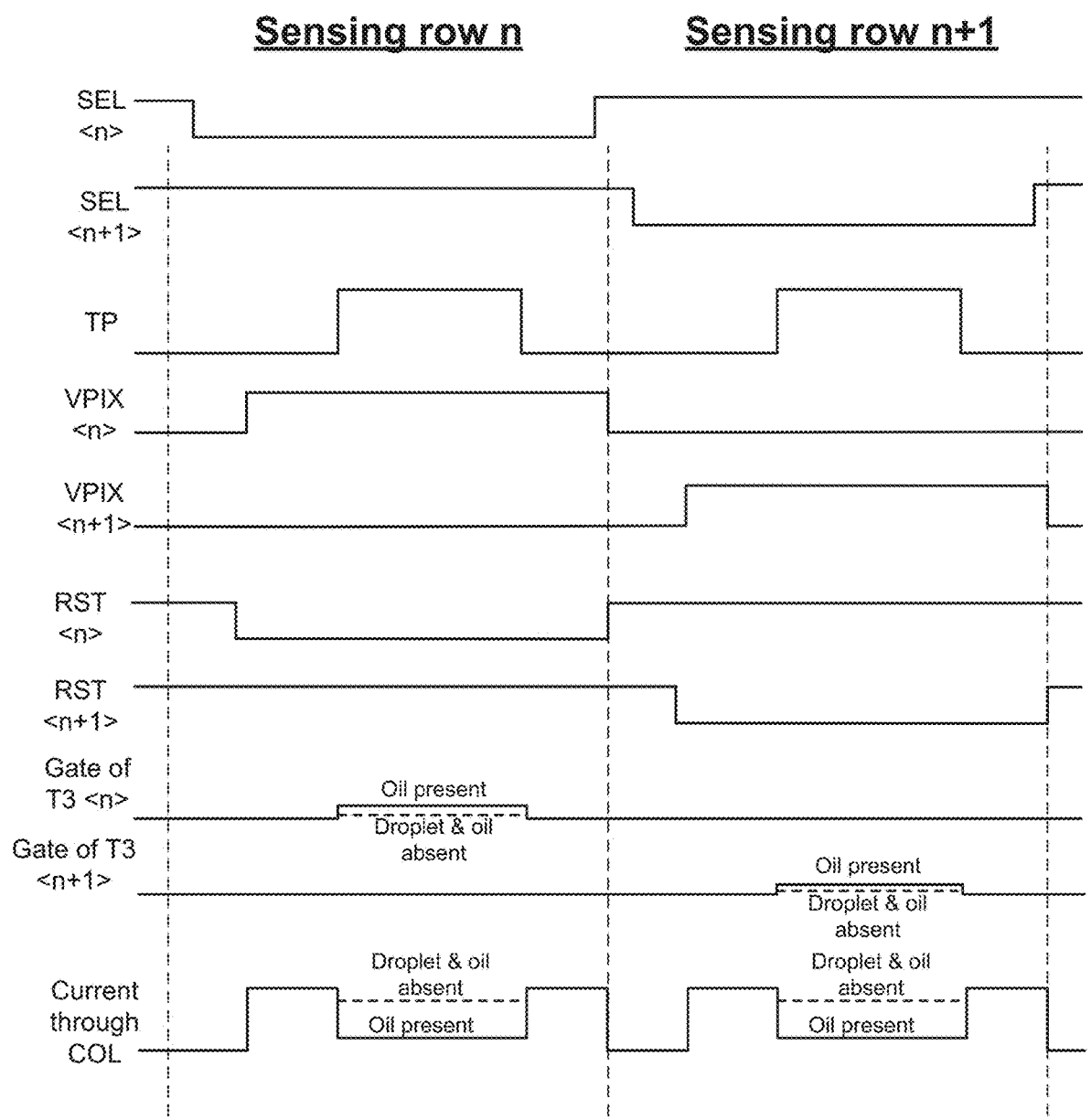
FIG. 26 is a timing diagram that illustrates the operation of the embodiment of FIG. 25.

As another example of a variation of applying a pre-charging effect, FIG. 25 is a drawing depicting a plurality of array elements including exemplary array element circuitry for an AM-EWOD device, in which p-type sensor readout transistor T3 is employed to allow a pre-charging effect to take place by which T3 is turned on during the sensing phase prior to applying the perturbation voltage. FIG. 26 is a timing diagram that illustrates the operation of the embodiment of FIG. 25. FIG. 25 depicts a pair of array elements in a Column(n) including a first array element 120 and a second array element 122 positioned in adjacent rows, respectively Row(n) and Row(n+1). Generally, the embodiment of FIG. 25 also is a modification of the circuit configuration of FIGS. 6 and 7, but with the use of a p-type sensor readout transistor T3 to allow a pre-charging effect to take place by which T3 is turned on during the sensing phase prior to applying the perturbation voltage.

Referring to the circuit configuration of FIG. 25 in combination with the timing diagram of FIG. 26, programming and actuation occurs comparably as in the previous design of FIG. 6. To simplify the illustration, the actuation circuit in FIG. 25 is represented by the memory block. To program a given array element 120 or 122 by writing voltage data to said array element, the actuation voltage to be programmed is loaded onto an addressing line SL, and a pulse is applied to the gate line GL appropriate for the row being programmed, which in this example is either Row(n) or Row (n+1). For actuation, a select signal SEL is applied to turn on T1 in the selected row, and the circuit node connected to the electrode is charged to the programmed voltage.

To perform sensing of a given row, say Row(n) in this example, the SEL(n) line is taken low to isolate the actuation circuit by turning off T1 for Row(n). In a reset step the reset transistor T2 of said row is turned on by a reset signal RST(n), and VCCA is applied to the gate of T3 to cancel effects of a previous frame. The reset voltage VCCA should be of a magnitude, relative to the standard VPIX voltage, that ensures that T3 is turned off. The pre-charging of T3 on the sensing row is performed by first taking the RST(n) signal low to decouple the gate of T3 from VCCA, and then shifting the VPIX(n) voltage that is connected to the source of T3 to turn on the p-type sensor readout transistor T3 to modify the current flowing through T3 and increase the magnitude of the difference between the gate and source voltages. Essentially, VPIX(n) is applied so as to turn T3 on so as to magnify the effect of small voltage perturbations at the gate of T3. Following the pre-charging, the reference (top) electrode potential for array element 120—TP—is perturbed to a higher voltage. The perturbation is coupled through the sensor capacitor C2 of Row(n) to the gate of the sensor readout transistor T3, and the change in the voltage at the gate of transistor T3 alters the current flow through T3 as generated from the pixel voltage supply VPIX(n). The resultant current from array element 120 passes through T3 and is sunk down the output line COL, which may then be sensed by column detection circuitry at the bottom of the column (not shown). In this case, if a liquid droplet or oil is present the output current will be reduced because the higher voltage at the gate of T3 will result in turning off the transistor by bringing the gate and the source voltages closer together. As in the previous embodiments, the pre-charging effect applied to T3, this time by turning on a p-type T3 via adjustment of VPIX(n), operates to increase the magnitude of the potential difference between the gate and source of the sensor readout transistor, thereby increasing the effect of a voltage perturbation at the gate on the resultant output current from the sensor readout transistor.

In this example, each row again is sensed independently of other rows. Accordingly, as shown in the timing diagram of FIG. 26, while Row(n) is being sensed, the select line for Row(n+1), SEL(n+1), remains high so that the actuation circuit remains electrically connected to the element (bottom) electrode of the array element. Additionally, the reset line for Row(n+1), RST(n+1), remains high throughout so that the gate of transistor T3 is held at the VCCA potential throughout the sensing period of row(n). This prevents anything coupling through to the output line COL from any other pixels connected to it other than on Row(n). The VPIX(n+1) signal is held at it's normal potential and is not pulsed like VPIX(n) so that T3 on row(n+1) does not get turned "on" and influence the current through COL.

The sensing operation is then repeated for Row(n+1), which is performed by resetting the sensor readout transistor gate voltage for Row(n+1) prior to applying the perturbation voltage to pre-charge it. Accordingly, the SEL(n+1) line is taken low to isolate the actuation circuit by turning off T1 for Row(n+1). In a reset step the reset transistor T2 of said row is turned on by a reset signal RST(n+1), and the reset voltage VCCA is applied to reset the voltage at the gate of T3. The reset voltage VCCA should be of a magnitude, relative to the standard VPIX(n+1) voltage, that ensures that T3 is turned off. The pre-charging of T3 on the sensing row is performed by first taking the RST(n+1) signal low to decouple the gate of T3 from VCCA. The VPIX(n+1) voltage shift is then applied to the source of the sensor readout transistor T3 to effectively turn T3 on by increasing the source voltage relative to the gate voltage at T3. Again, a current will flow through T3 due to application of the pixel voltage supply VPIX(n+1), with the current being dependent upon the voltage across the source and the gate of T3. Following the pre-charging, the reference electrode potential for array element 122—TP—is perturbed to a higher voltage. The perturbation is coupled through the sensor capacitor C2 of Row(n+1) to the gate of the sensor readout transistor T3, and the change in the voltage at the gate of transistor T3 alters the current flow through T3 as generated from the pixel voltage supply VPIX(n+1). The resultant current from array element 122 passes through T3 and is sunk down the output line COL, which may then be sensed by column detection circuitry at the bottom of the column (not shown). Again, the pre-charging effect applied to T3, by turning on p-type T3 and adjusting the current through T3 via adjustment of VPIX(n+1), operates to increase the effect of a voltage perturbation at the gate on the resultant output current from the sensor readout transistor. For independent sensing, while Row(n+1) is being sensed, now the select line for Row(n), SEL(n), remains high so that the actuation circuit remains electrically connected to the element (bottom) electrode of the array element 120. Additionally, the RST(n) signal remains high throughout so that the gate of transistor T3 is held at the VCCA potential throughout the sensing period of row(n+1) to prevent anything coupling through to the output line COL from any other pixels connected to it other than on row(n+1). The VPIX(n) signal is held at its normal potential and is not pulsed like VPIX(n+1) so that T3 on row(n) does not get turned "on" and influence the current through COL.

As seen in the timing diagram of FIG. 26, the level of the voltage at the gate of the sensor readout transistor T3, and thus the resultant current sunk down the output line COL, is dependent upon whether a droplet or oil is present or absent. For each array element 120 and 122, therefore, the presence or absence of a droplet or oil is sensed. In addition, the degree of sensitivity is enhanced by the pre-charging operation applied to the p-type sensor readout transistor T3 by adjusting VPIX during the sensing phase, which has the numerous advantages described above over conventional configurations.

In the above examples, the perturbation for sensing was applied by perturbing the reference electrode (top electrode TP). More generally, the perturbation voltage may be sourced from any suitable voltage source external from the array element being sensed. For example, another method may employ applying a voltage pulse through the electrode of an adjacent array element. Such method has a comparable effect, but there can be a stronger link to the properties of the device closer to the bottom surface of the device, which are better detected by perturbing an in-plane electrode of an adjacent array element versus using the TP electrode in a different plane (e.g., top electrode) and coupling such perturbation through the device layers to the element (bottom) electrode. Such method may enhance sensing for droplet presence in a local vicinity.

The methods of perturbing electrodes of adjacent array elements may be expanded into perturbing and sensing groups of electrodes. The result is to increase the size of coupling capacitance to generate a larger signal. Relatedly, a larger output can be achieved by a combined output of multiple sensor readout transistors, and this permits the device to be less turned on when a larger sensing output is coming through. Various combinations of sensing and perturbing multiple array elements may be employed to generate a larger sensing output. Examples include (without limitation): sensing multiple array elements with a common TP perturbation spanning multiple elements; sensing multiple array elements with a single TP perturbation from a neighbor array element; sensing multiple array elements with multiple TP perturbation signals from multiple elements; sensing a single array element with multiple TP perturbation signals from multiple neighboring elements; and perturbing multiple array elements on different sides or a same side of an array element being sensed, or sequentially on different sides so as to provide additional position information on a droplet layout.

For example, FIG. 27 is a drawing depicting an exemplary operation that employs perturbing and sensing over multiple array elements in an element array 200. In this example, a first grouping 202 of 2×2 array elements is perturbed, and the resulting output signal is read from a second and adjacent grouping 204 of 2×2 array elements being sensed. The two array element groupings are depicted relative to a droplet 206. It will be appreciated that any suitable number of array elements may be included in the perturbing group and the sensing group, and the number of array elements maybe be the same or different in the two groups. The output signal is read by readout circuitry 208 that is switchable to read the desired output signal. In such an embodiment, increasing the number of array elements being perturbed and/or read out increases the coupling capacitance to produce a larger output signal. Different perturbing and sensing array element combinations may be employed as identified above. Further in combination with the increased sensitivity of the array element circuitry, by turning on the sensor readout transistor of each array element being sensed prior to applying the perturbation voltage, a highly effective and accurate sensing operation is achieved.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The described embodiments could be used to provide an enhance AM-EWOD device. The AM-EWOD device could form a part of a lab-on-a-chip system. Such devices could be used for optical detection of biochemical or physiological materials, such as for cell detection and cell counting. Applications include healthcare diagnostic testing, material testing, chemical or biochemical material synthesis, proteomics, tools for research in life sciences and forensic science.

REFERENCE SIGNS LIST

32—reader
34—cartridge

35—external sensor module
36—AM-EWOD device
38—control electronics
40—storage device
44—lower substrate assembly
46—thin film electronics
48—array element electrodes
48A—array element electrode
48B—array element electrode
50—two-dimensional element array
51—array element
52—liquid droplet
54—top substrate
56—spacer
58—reference electrode
60—non-polar fluid
62—insulator layer
64—first hydrophobic coating
66—contact angle
68—second hydrophobic coating
70A—electrical load with droplet present
70B—electrical load without droplet present
72—array element circuit
74—integrated row driver
76—column driver
78—integrated sensor row addressing
80—column detection circuits
82—serial interface
84—voltage supply interface
86—connecting wires
100—first array element
102—second array element
104—first array element
106—second array element
108—first array element
110—second array element
112—first array element
114—second array element
116—first array element
116a—first array element
116b—first array element
118—second array element
118a—second array element
18b—second array element
120—first array element
122—second array element
200—element array
202—first grouping of array elements
204—second grouping of array element
206—liquid droplet
208—readout circuitry

What is claimed is:

1. An active matrix electro-wetting on dielectric (AM-EWOD) device comprising:
   a plurality of array elements arranged in an array of rows and columns, each of the array elements including array element circuitry, an element electrode, and a reference electrode;
   wherein the array element circuitry comprises:
   actuation circuitry configured to apply actuation voltages to the element and reference electrodes for actuating the array element; and
   impedance sensor circuitry configured to sense impedance at the array element electrode to determine a droplet or device property at the array element, the impedance sensor circuitry comprising a sensor capacitor and a sensor readout transistor that outputs an output current for sensing;
   and wherein:
   the sensor capacitor is electrically connected to a gate of the sensor readout transistor such that during a sensing phase a voltage perturbation is coupled through the sensor capacitor to the gate of the sensor readout transistor; and
   the impedance sensor circuitry further comprises a pre-charging element that is connected between a gate of the sensor readout transistor and a variable pre-charging voltage supply line, wherein during the sensing phase the pre-charging voltage supply line provides a pre-charging voltage through the pre-charging element to the gate of the sensor readout transistor that operates to turn on the sensor readout transistor during the sensing phase prior to the voltage perturbation, thereby increasing the effect of the voltage perturbation on the output current.

2. The AM-EWOD device of claim 1, wherein the pre-charging element of the impedance sensor circuitry comprises a reset transistor that is connected between the gate of the sensor readout transistor and a pre-charging voltage address line, and the reset transistor is turned on to apply the pre-charging voltage to the gate of the sensor readout transistor during the sensing phase, the pre-charging voltage having a magnitude sufficient to turn on the sensor readout transistor.

3. The AM-EWOD device of claim 2, wherein the reset transistor is turned on to apply the pre-charging voltage to the gate of the sensor readout transistor prior to coupling of the voltage perturbation.

4. The AM-EWOD device of claim 1, wherein the pre-charging element of the impedance sensor circuitry comprises a boost capacitor that is connected between the gate of the sensor readout transistor and a voltage supply input, and the voltage supply input supplies a pre-charging voltage through the boost capacitor to the gate of the sensor readout transistor during the sensing phase, the pre-charging voltage having a magnitude sufficient to turn on the sensor readout transistor.

5. The AM-EWOD device of claim 4, wherein the impedance sensor circuitry further comprises a reset transistor configured to reset the voltage at the gate of the sensor readout transistor prior to application of the pre-charging voltage from the voltage supply input.

6. The AM-EWOD device of claim 4, wherein the voltage supply input to the boost capacitor is also connected to a different terminal of the sensor readout transistor.

7. The AM-EWOD device of claim 1, wherein:
   the pre-charging element of the impedance sensor circuitry comprises a p-type sensor readout transistor and a reset transistor that is connected between the gate of the p-type sensor readout transistor and a reset voltage address line;
   the reset transistor is turned on to apply a reset voltage to the gate of the p-type sensor readout transistor prior to coupling of the voltage perturbation, the reset voltage having a magnitude selected to turn off the p-type sensor readout transistor; and
   a source of the p-type sensor readout transistor is connected to a voltage input supply line, and a voltage applied from the voltage input supply line is adjusted to increase the magnitude of a potential difference between the gate and source of the p-type sensor readout transistor to turn on the sensor readout transistor.

8. The AM-EWOD device of claim 1, wherein the impedance sensor circuitry of each array element further includes a storage capacitor connected to the sensor capacitor oppositely from the gate of the sensor readout transistor.

9. The AM-EWOD device of claim 1, wherein the actuation circuit of each array element couples an input actuation voltage to the element electrode.

10. The AM-EWOD device of claim 9, wherein the input actuation voltage is an AC voltage.

11. The AM-EWOD device of claim 9, wherein the input activation voltage is a DC voltage.

12. A method of operating an active matrix electro-wetting on dielectric (AM-EWOD) device comprising the steps of:
arranging a plurality of array elements in an array of rows and columns, each of the array elements including array element circuitry, an element electrode, and a reference electrode;
wherein the array element circuitry of each array element comprises: actuation circuitry configured to apply actuation voltages to the element and reference electrodes for actuating the array element; and impedance sensor circuitry configured to sense impedance at the array element electrode to determine a droplet or device property at the array element, the impedance sensor circuitry comprising a sensor capacitor and a sensor readout transistor that outputs an output current for sensing; and
performing a sensing operation on an array element being sensed by the steps of:
performing a pre-charging operation to the array element being sensed that increases a magnitude of a potential difference between the gate and a source of the sensor readout transistor of the array element being sensed sufficiently to turn on the sensor readout transistor of the array element being sensed;
after performing the pre-charging operation to turn on the sensor readout transistor of the array element being sensed, perturbing a voltage applied to the array element being sensed and coupling the perturbed voltage through the sensor capacitor to the gate of the sensor readout transistor of the array element being sensed; and
measuring an output current from the sensor readout transistor of the array element being sensed in response to perturbing the voltage to measure the device or droplet property at the array element being sensed.

13. The method of operating of claim 12, wherein the impedance sensor circuitry of each array element comprises a reset transistor that is connected between the gate of the sensor readout transistor and a pre-charging voltage address line;
wherein the pre-charging operation to the array element being sensed includes applying a reset signal to turn on the reset transistor of the array element being sensed, and applying a pre-charging voltage from the pre-charging voltage address line through the reset transistor to the gate of the sensor readout transistor of the array element being sensed, the pre-charging voltage having a magnitude sufficient to turn on the sensor readout transistor.

14. The method of operating of claim 12, wherein the impedance sensor circuitry of each array element comprises a boost capacitor that is connected between the gate of the sensor readout transistor and a voltage supply input;
wherein the pre-charging operation to the array element being sensed includes applying a pre-charging voltage from the voltage supply input through the boost capacitor to the gate of the sensor readout transistor of the array element being sensed, the pre-charging voltage having a magnitude sufficient to turn on the sensor readout transistor.

15. The method of operating of claim 14, wherein the impedance sensor circuitry of each array element further comprises a reset transistor connected between the gate of the sensor readout transistor and a reset voltage line;
the method of operating further comprising, before the pre-charging operation, applying a reset voltage from the reset voltage line through the reset transistor to the gate of the sensor readout transistor of the array element being sensed to reset the voltage at said gate of the sensor readout transistor.

16. The method of operating of claim 14, wherein the voltage supply input to the boost capacitor is also connected to a different terminal of the sensor readout transistor.

17. The method of operating of claim 12, wherein:
the impedance sensor circuitry of each array element comprises a p-type sensor readout transistor having a source connected to a voltage input supply line, and a reset transistor that is connected between the gate of the p-type sensor readout transistor and a reset voltage address line;
wherein the pre-charging operation to the array element being sensed includes:
turning on the reset transistor and applying a reset voltage through the reset transistor to the gate of the p-type sensor readout transistor of the array element being sensed, the reset voltage having a magnitude selected to turn off the p-type sensor readout transistor; and
applying a voltage from the voltage input supply line and adjusting the voltage to increase the magnitude of the potential difference between the gate and source of the p-type sensor readout transistor of the array element being sensed to turn on the sensor readout transistor.

18. The method of operating of claim 12, further comprising isolating the element electrode of the array element being sensed from the actuation circuitry while performing the sensing operation.

19. The method of operating of claim 12, further comprising applying an actuation voltage to another array element with the actuation circuitry to actuate the another array element while performing the sensing operation on the array element being sensed, thereby effecting the capacitance measurement in the array element being sensed.

20. The method of operating of claim 12, further comprising performing the sensing operation on a second array element being sensed according to claim 12.

21. The method of operating of claim 12, wherein perturbing a voltage applied to an array element being sensed comprises perturbing a voltage applied to the element electrode or reference electrode of the array element being sensed.

22. The method of operating of claim 12, wherein perturbing a voltage applied to an array element being sensed comprises perturbing a voltage applied to an array element different from the array element being sensed, and coupling the perturbed voltage to the array element being sensed.

23. The method of operating of claim 22, wherein perturbing a voltage applied to an array element being sensed comprises perturbing a voltage applied to a group of array elements, and coupling the perturbed voltage to the array element being sensed.

24. The method of operating of claim 22, wherein the perturbed voltage is coupled to a group of the array elements being sensed.

* * * * *